United States Patent
Mayer et al.

(10) Patent No.: US 11,909,568 B2
(45) Date of Patent: *Feb. 20, 2024

(54) TECHNIQUES FOR COMMUNICATING MULTI-LEVEL SIGNALS

(71) Applicant: Micron Technology, Inc., Boise, ID (US)

(72) Inventors: Peter Mayer, Neubiberg (DE); Nobuyuki Umeda, Tokyo (JP); Casto Salobrena Garcia, Munich (DE); Rethin Raj, Augsburg (DE); Andreas Schneider, Gernlinden (DE)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/840,525

(22) Filed: Jun. 14, 2022

(65) Prior Publication Data

US 2022/0368573 A1  Nov. 17, 2022

Related U.S. Application Data

(63) Continuation of application No. 17/322,022, filed on May 17, 2021, now Pat. No. 11,394,589.

(51) Int. Cl.
*H04L 27/02* (2006.01)
*H04L 25/49* (2006.01)
(Continued)

(52) U.S. Cl.
CPC .......... *H04L 25/4919* (2013.01); *H03K 7/02* (2013.01); *H04L 25/03878* (2013.01); *H04B 10/40* (2013.01)

(58) Field of Classification Search
CPC ............ H04B 1/12; H04B 1/123; H04B 1/00; H04B 10/524; H04B 10/541;
(Continued)

(56) References Cited

U.S. PATENT DOCUMENTS 6,772,351 B1   8/2004  Werner et al.
7,124,221 B1  10/2006  Zerbe et al.
(Continued)

FOREIGN PATENT DOCUMENTS

CN   103238304 A   8/2013
CN   110832589 A   2/2020

OTHER PUBLICATIONS

Chinese Patent Office, "Office Action," issued in connection with Chinese Patent Application No. 202210528450.2 dated Mar. 22, 2023 (9 pages).

(Continued)

*Primary Examiner* — Eva Y Puente
(74) *Attorney, Agent, or Firm* — Holland & Hart LLP

(57) ABSTRACT

Methods, systems, and devices for techniques for communicating multi-level signals are described. A first device may be configured to communicate signals with a second device according to a modulation scheme. The first device may transmit a first signal to the second device at a first voltage level of the modulation scheme corresponding to a first multi-bit value. The first device may select a second voltage level of the modulation scheme based on a difference between the first voltage level and a third voltage level of the PAM scheme, and may transmit a second signal to the second device at the second voltage level to indicate a second multi-bit value corresponding to the third voltage level. The second device may decode the second signal to determine the second multi-bit value based on receiving the first signal at the first voltage level and the second signal at the second voltage level.

20 Claims, 9 Drawing Sheets

(51) Int. Cl.
*H04L 25/03* (2006.01)
*H03K 7/02* (2006.01)
*H04B 10/40* (2013.01)

(58) Field of Classification Search
CPC .................. H04B 17/0085; H04B 3/32; H04L 25/4917; H04L 25/0272; H04L 1/22; H04L 25/0264; H04L 25/03878; H04L 25/4919; H04L 27/02; H04J 3/0638; H04J 14/08; H04J 14/086
USPC ........................................................ 375/262
See application file for complete search history.

(56) References Cited

U.S. PATENT DOCUMENTS

| | | | |
|---|---|---|---|
| 8,325,540 B1* | 12/2012 | Kutz | G11C 5/147 365/189.12 |
| 10,312,896 B2 | 6/2019 | Kim et al. | |
| 11,196,595 B2 | 12/2021 | Farzan et al. | |
| 11,394,589 B1* | 7/2022 | Mayer | H04L 25/03878 |
| 2003/0016770 A1* | 1/2003 | Trans | H04B 3/32 375/346 |
| 2009/0122904 A1 | 5/2009 | Jang et al. | |
| 2011/0243269 A1* | 10/2011 | Kogawa | H04L 27/361 375/295 |
| 2013/0251060 A1 | 9/2013 | Ikushima et al. | |
| 2019/0044766 A1 | 2/2019 | Lin et al. | |
| 2019/0363917 A1* | 11/2019 | Iwai | H04B 10/541 |
| 2020/0066309 A1 | 2/2020 | Mayer et al. | |
| 2020/0233741 A1* | 7/2020 | Brox | G06F 13/1694 |
| 2021/0319811 A1* | 10/2021 | Mayer | G11C 29/021 |
| 2021/0377080 A1 | 12/2021 | Park et al. | |
| 2022/0059156 A1 | 2/2022 | Park et al. | |
| 2022/0070031 A1* | 3/2022 | Ganesan | H04L 7/033 |
| 2022/0255566 A1* | 8/2022 | Chakraborty | H04B 1/40 |
| 2022/0262447 A1* | 8/2022 | Sudhakaran | G11C 29/12005 |

OTHER PUBLICATIONS

Chinese Patent Office, "Notice of Allowance," issued in connection with Chinese Patent Application No. 202210528450.2 dated Aug. 14, 2023 (4 pages).

* cited by examiner

TECHNIQUES FOR COMMUNICATING MULTI-LEVEL SIGNALS

CROSS REFERENCE

The present application for patent is a continuation of U.S. patent application Ser. No. 17/322,022 by Mayer, et al., entitled "TECHNIQUES FOR COMMUNICATING MULTI-LEVEL SIGNALS", filed May 17, 2021, assigned to the assignee hereof, and is expressly incorporated by reference in its entirety herein.

FIELD OF TECHNOLOGY

The following relates generally to one or more systems for memory and more specifically to techniques for communicating multi-level signals.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
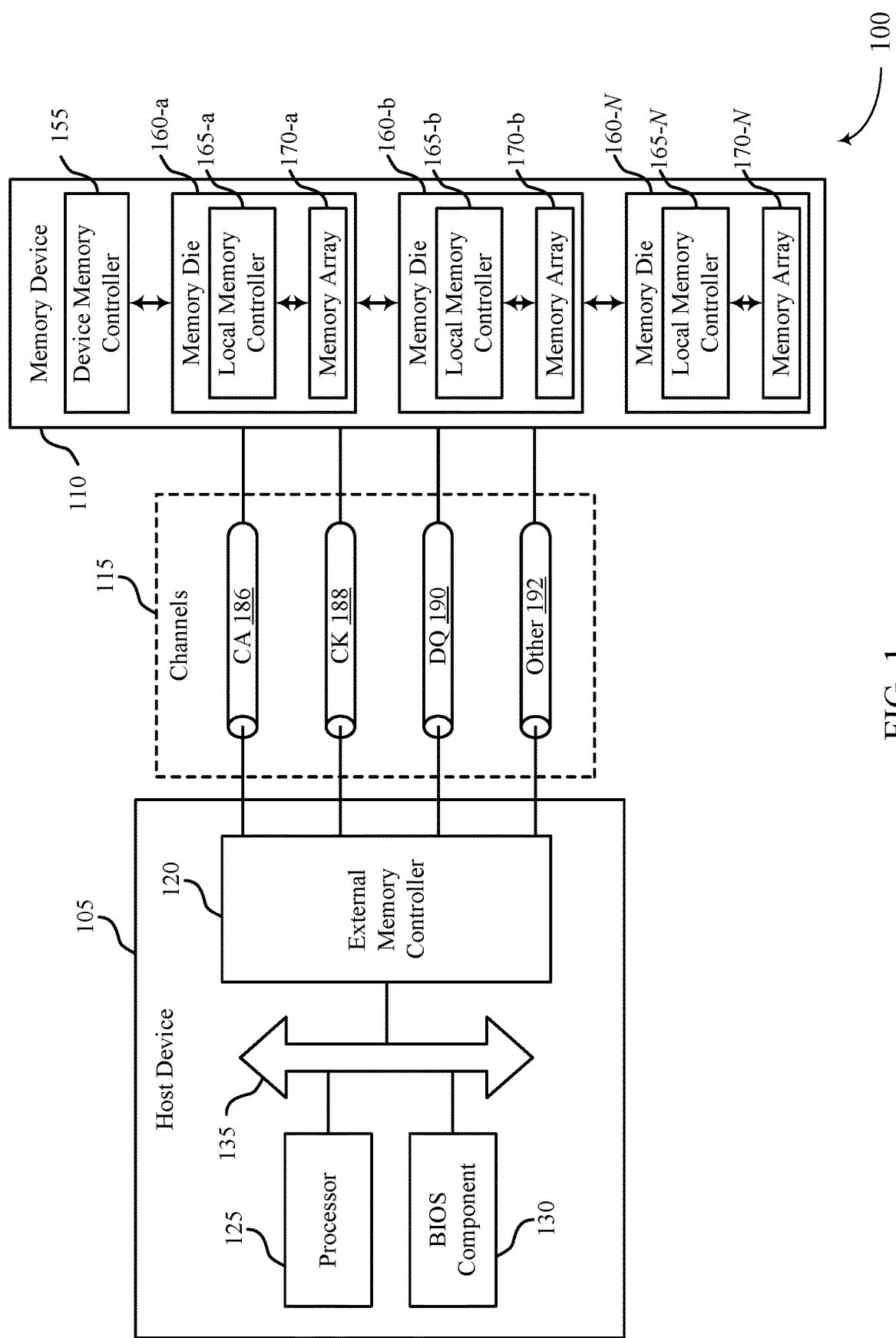
FIG. 1 illustrates an example of a system that supports techniques for communicating multi-level signals in accordance with examples as disclosed herein.

A device, such as a host device or a memory device, may communicate signals over transmission lines of a bus according to various modulation schemes. In some examples, a signal (e.g., a read signal, a write signal) may be a multi-level signal that is modulated to represent more than one bit of data. For example, a device may be configured to communicate signals according to a pulse-amplitude-modulation (PAM) scheme in which a signal may be transmitted at a given voltage level of the PAM scheme to indicate a multi-bit value (e.g., '00', '01', '10', '11', '000', '001', or some other multi-bit value) corresponding to the signal. To communicate multiple signals (e.g., a sequence of multi-bit values), the device may transition between different voltage levels corresponding to the multiple signals. For example, the device may communicate (e.g., transmit, receive) a first signal at a first voltage level to indicate a first multi-bit value and may transition to a second voltage level to communicate a second signal corresponding to a second multi-bit value.

In some cases, however, transitioning from one voltage level to another voltage level, such as a relatively high voltage level to a relatively low voltage level (e.g., or vice versa), may adversely affect various parameters (e.g., may reduce a data eye margin) associated with the PAM scheme. For example, transitioning from one voltage level to another voltage level may reduce a window during which a device may sample and properly decode a signal, thus reducing a reliability of the signal. Additionally or alternatively, transitioning from one voltage level to another voltage level may reduce a speed of a system due to, for example, a device reducing a speed at which signals are communicated to increase the data eye margin and compensate for relatively larger voltage level transitions, among other examples.

Techniques, systems, and devices are described for reducing voltage level transition sizes to increase signal reliability and communication speeds. For example, one or more voltage levels of a modulation scheme (e.g., a PAM scheme, some other modulation scheme) may be used to indicate one or more multi-bit values based on a voltage level of a previously communicated signal. The one or more voltage levels may be used to reduce voltage level transition sizes (e.g., voltage level swings) and may be referred to in some examples as one or more cancellation voltage levels. For example, a first device (e.g., a host device, a memory device) may transmit a first signal to a second device (e.g., a memory device, a host device) at a first voltage level of a modulation scheme (e.g., the PAM scheme) that corresponds to a first multi-bit value. The first device may determine to transmit a second signal that indicates a second multi-bit value corresponding to a second voltage level of the modulation scheme. To reduce a voltage level transition between the transmitting the first signal corresponding to the first multi-bit value and the second signal corresponding to the second multi-bit value, the first device may transmit the second signal at a different voltage level than otherwise would be used for conveying or corresponding to the second multi bit value, such as a cancellation voltage level, of the modulation scheme to indicate the second multi-bit value. For example, a voltage difference between the first voltage level and the cancellation voltage level may be less than a voltage difference between the first voltage level and the second voltage level. By transmitting the second signal at the cancellation voltage level instead of the second voltage level, the first device may indicate the second multi-bit value corresponding to the second voltage level based on transmitting the first signal at the first voltage level and based on transmitting the second signal at the cancellation voltage level. Accordingly, the second device may decode the second signal to determine the second multi-bit value corresponding to the second voltage level based on receiving the first signal at the first voltage level and the second signal at the cancellation voltage level. Communicating signals in this way may, among other advantages, may increase signal reliability and communication speeds, for example, by reducing voltage level transition sizes (e.g., by transitioning to an intermediate voltage level between two voltage levels) and increasing data eye margins associated with communicating multi-bit values between devices.

Features of the disclosure are initially described in the context of systems and dies as described with reference to FIGS. 1 and 2. Features of the disclosure are described in the context of a voltage level diagram, an eye diagram, signal diagrams, a system, and a process flow as described with reference to FIGS. 3-6. These and other features of the disclosure are further illustrated by and described with reference to an apparatus diagram and flowcharts that relate to techniques for communicating multi-level signals as described with reference to FIGS. 7-9.

FIG. 1 illustrates an example of a system 100 that supports techniques for communicating multi-level signals in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, PAM having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, a logic 11, a logic 000, a logic 001, or any other logic state). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, multi-level, or higher-order modulation schemes and symbols.

Accordingly, in some examples, a device such as the host device 105 or the memory device 110 may be configured to use a multi-level modulation scheme (e.g., a modulation scheme that includes at least three levels to encode, decode, or both more than one bit of information per modulation symbol) to modulate information (e.g., data, control information) for communication. The device may communicate the modulated information over multiple signals via one or more buses, which may include aspects of the channels 115. For example, the device may modulate or demodulate the information according to a modulation scheme (e.g., a PAM scheme) that uses different voltage levels to represent different symbol values. The device may communicate the modulated information by communicating the multiple signals via a bus at respective voltage levels of the PAM scheme corresponding to desired symbol values. It is noted that symbol values may also be referred to herein as symbol levels, multi-bit values, PAM symbol values, PAM symbol levels, or other suitable terminology.

In some examples, to transmit a first signal via a bus, the device may include a driver that drives a transmission line of the bus to a first voltage level corresponding to a first symbol level of a modulation scheme (e.g., a PAM scheme). To transmit a second signal corresponding to a second symbol level different than the first symbol level, the device may drive the transmission line of the bus to a second voltage level corresponding to the second symbol level, thereby transitioning the voltage level of the transmission line of the bus from first voltage level to the second voltage level. In some cases, however, a voltage difference between the first voltage level and the second voltage level may be relatively large (e.g., satisfy a threshold), and a transition from the first voltage level to the second voltage level may reduce a data eye margin associated with the modulation scheme and reduce (e.g., limit) a speed at which signals may be communicated via the bus, among other disadvantages.

To increase a data eye margin of a modulation scheme and a system performance and speed, among other advantages, the device may use one or more alternative voltage levels, such as one or more cancellation voltage levels, for communicating signals to reduce voltage level transition sizes. For example, a cancellation voltage level of a modulation scheme may not itself correspond to a particular symbol level of a modulation scheme. Rather, a cancellation voltage level may indicate a symbol level of the modulation scheme based at least in part on the voltage level of another signal, such as a previously communicated signal or a next communicated signal.

For instance, a first device (e.g., the host device 105, the memory device 110) may transmit a first signal to a second device (e.g., the memory device 110, the host device 105) at a first voltage level of the modulation scheme corresponding to a first symbol level (e.g., a first multi-bit value). To reduce a voltage level transition, the first device may transmit a second signal (e.g., a next signal) to the second device at a cancellation voltage level to indicate a second symbol level that corresponds to a second voltage level of the modulation scheme. For example, the cancellation voltage level may be between the first voltage level and the second voltage level.

In some examples, to reduce a voltage level transition, the first device may transmit a first signal to the second device at a cancellation voltage level to indicate a second symbol level that corresponds to a second voltage level of the modulation scheme. For example, the cancellation voltage level may be between a first voltage level and a second voltage level. The first device (e.g., the host device 105, the memory device 110) may transmit another signal (e.g., a second signal) to a second device (e.g., the memory device 110, the host device 105) at a first voltage level of the modulation scheme corresponding to a first symbol level (e.g., a first multi-bit value), which may in some examples be after transmitting the first signal to the second device at the cancellation voltage level. The first signal transmitted at the second voltage level may indicate the second symbol level based on transmitting the second signal at the first voltage level (e.g., after the first signal).

Accordingly, a voltage difference between the first voltage level and the cancellation voltage level may be less than a voltage difference between the first voltage level and the second voltage level. Thus, a transition from the first voltage level to the cancellation voltage level may be smaller than a transition from the first voltage level to the second voltage level. The second device may receive the second signal at the cancellation voltage level and may decode the second signal to determine the second symbol level based on receiving the first signal at the first voltage level and the second signal at the second voltage level.

Figure 2:
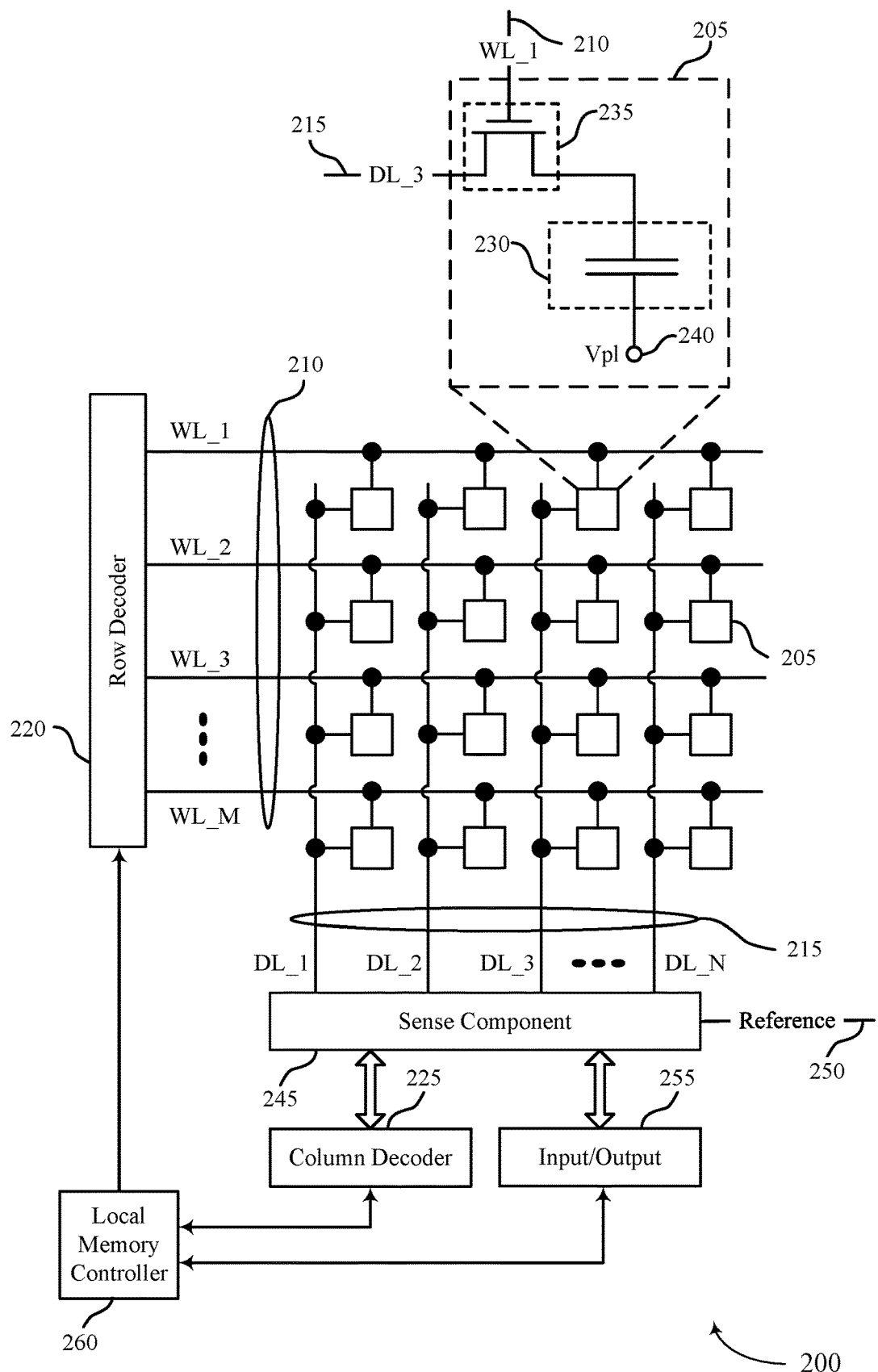
FIG. 2 illustrates an example of a memory die that supports techniques for communicating multi-level signals in accordance with examples as disclosed herein.

FIG. 2 illustrates an example of a memory die 200 that supports techniques for communicating multi-level signals in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be operable to couple and/or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. In some examples, the desired logic state may be indicated using a given voltage level, which may be referred to as a cancellation voltage level. For example, the local memory controller 260 may receive a signal from a host device at a given voltage level, such as a cancellation voltage level. The local memory controller 260 may determine the desired logic state indicated by the cancellation voltage level based on a voltage level used to indicate a previously desired logic state for another signal or alternatively based on a voltage level used to indicate a later desired logic state for another signal.

The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some examples, the local memory controller 260 may indicate the determined logic state to a host device using a given voltage level that does not itself correspond to a specific logic state, such as a cancellation voltage level. For example, the local memory controller 260 may transmit a signal to a host device at the cancellation voltage to indicate the determined logic state based on a voltage level of a previously transmitted signal corresponding to a previously determined logic state or alternatively based on a voltage level of a next transmitted signal corresponding to a next determined logic state.

Figure 3:
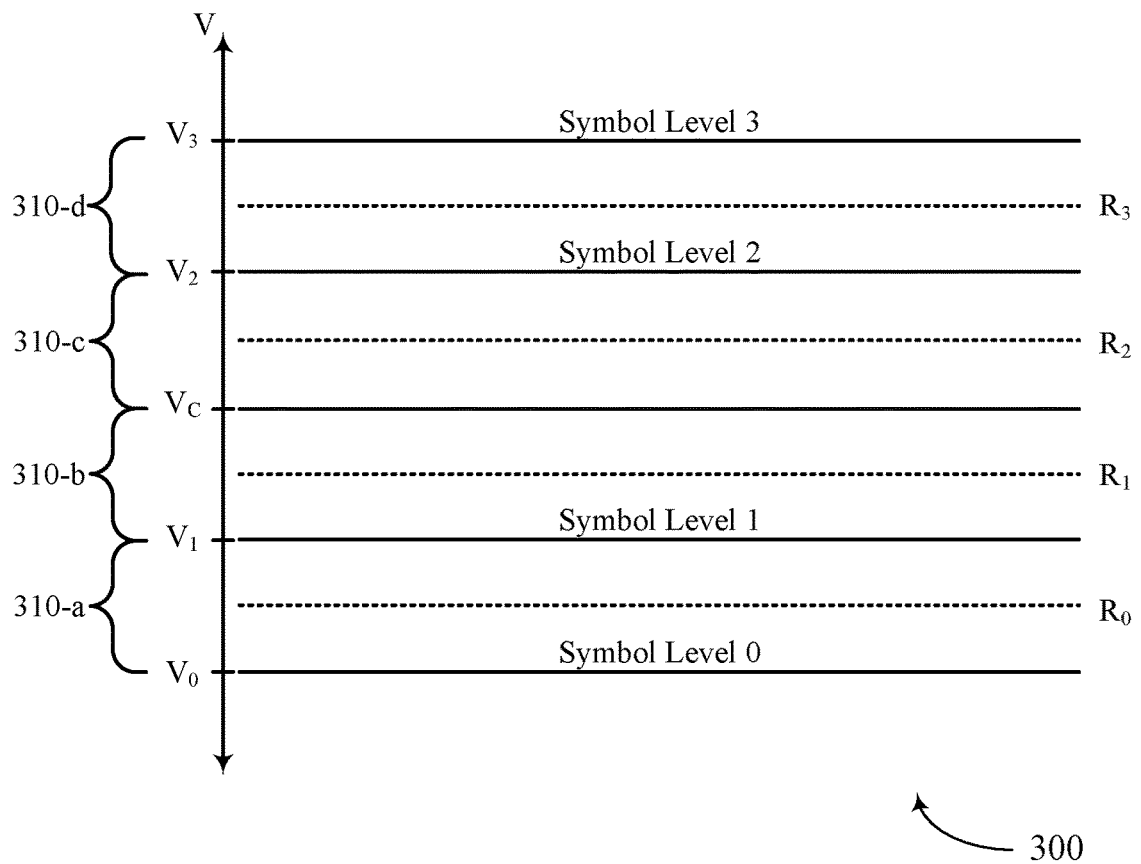
FIG. 3 illustrates an example of a voltage level diagram and an eye diagram that supports techniques for communicating multi-level signals in accordance with examples as disclosed herein.
Figure 3:
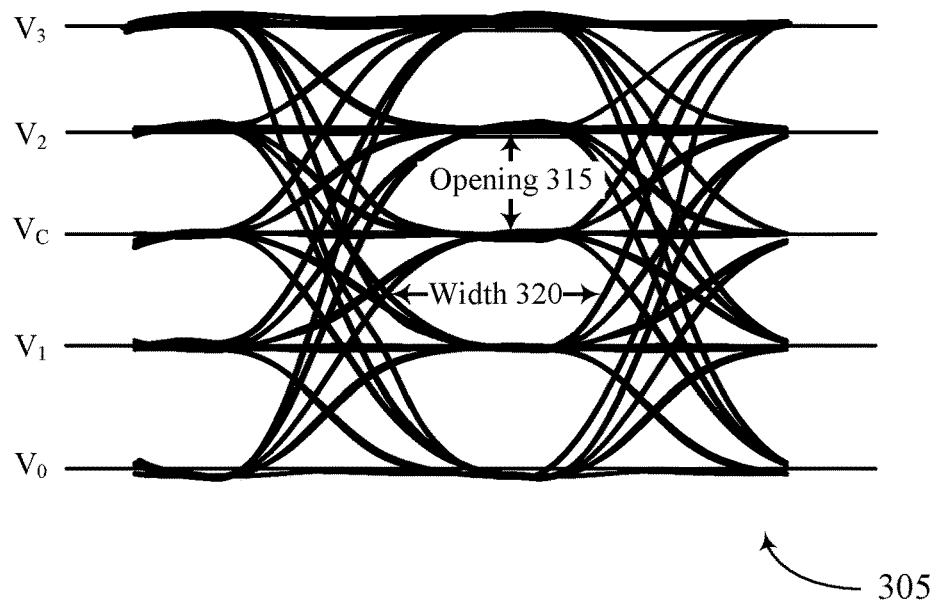

FIG. 3 illustrates an example of a voltage level diagram 300 and an eye diagram 305 that supports techniques for communicating multi-level signals in accordance with examples as disclosed herein. The voltage level diagram 300 depicts examples of voltage levels of a modulation scheme (e.g., a PAM scheme) that implements a cancellation voltage as described herein. For example, the voltage level diagram 300 may include: a first voltage level ($V_0$) corresponding to a first symbol level 0 that represents a first multi-bit value, a second voltage level ($V_1$) corresponding to a second symbol level 1 that represents a second multi-bit value, a cancellation voltage level ($V_C$), a third voltage level ($V_2$) corresponding to a third symbol level 2 that represents a third multi-bit value, and a fourth voltage level ($V_3$) corresponding to a fourth symbol level 3 that represents a fourth multi-bit value.

A multi-bit value represented by a given symbol level may be based on an encoding scheme implemented by a device such as a memory device or a host device. For example, a device may implement a Gray coding scheme, a linear encoding scheme, or another encoding scheme, which may be used to determine the multi-bit value corresponding to a particular symbol level. For instance, if implementing a Gray coding scheme, the symbol level 0 may represent a '00' multi-bit value, the symbol level 1 may represent a '01' multi-bit value, the symbol level 2 may represent a '11' multi-bit value, and the symbol level 3 may represent a '10' multi-bit value. If implementing a linear encoding scheme, the symbol level 0 may represent a '00' multi-bit value, the symbol level 1 may represent a '01' multi-bit value, the symbol level 2 may represent a '10' multi-bit value, and the symbol level 3 may represent a '11' multi-bit value.

Although FIG. 3 is described in the context of four multi-bit values, other examples and different distributions of multi-bit values and different quantities of multi-bit values are additionally and alternatively contemplated. Additionally, although five voltage levels are depicted, the present disclosure can be extended and can apply to various quantities of voltage levels.

The voltage levels depicted in the voltage level diagram 300 may each be separated by a voltage 310. For example, a voltage 310-$a$ may separate $V_0$ and $V_1$, a voltage 310-$b$ may separate $V_1$ and $V_C$, a voltage 310-$c$ may separate $V_C$ and $V_2$, and a voltage 310-$d$ may separate $V_2$ and $V_3$. In some examples, the differences between the voltage levels may be the same. For example, the voltages 310-$a$, 310-$b$, 310-$c$, and 310-$d$ may be equal or approximately equal. In some other examples, one or more of the differences between the voltage levels may be different. For example, the differences between one or more of the voltages 310-$a$, 310-$b$, 310-$c$, and 310-$d$ may be different than the other voltages 310. In an example, $V_0$ may be –0.6V, $V_1$ may be –0.3V, $V_C$ may be 0V (e.g., ground), $V_2$ may be 0.3V, and $V_3$ may be 0.6V. Here, as depicted, each of the voltages 310-$a$, 310-$b$, 310-$c$, and 310-$d$ may be 0.3V (e.g., and thus be equal). It is noted, however, that other values for the voltage levels and voltages 310 are contemplated and are within the scope of this disclosure.

A device may generate the voltage levels depicted in the voltage level diagram 300 by operating one or more drivers coupled with a transmission line of a bus. For example, the device may use the one or more drivers to drive a voltage level of the transmission line to any of $V_0$, $V_1$, $V_C$, $V_2$, or $V_3$. The device may drive the voltage level of the transmission line to transmit a signal corresponding to one of the symbol levels, thereby indicating a corresponding multi-bit value.

Additionally or alternatively, a device may include a set of receivers to determine a multi-bit value indicated by a signal. For example, to distinguish between the voltage levels when decoding the signal, each receiver of the set of receivers may be configured to compare the voltage level of a signal to a reference voltage level R. Based on the comparison, the device may determine the symbol level of the signal or that the voltage level of the signal corresponds to $V_C$. For instance, in the example of FIG. 3, a first receiver of the set of receivers may compare the voltage level of the signal to a reference voltage level $R_0$, a second receiver of the set of receivers may compare the voltage level of the signal to a reference voltage level $R_1$, a third receiver of the set of receivers may compare the voltage level of the signal to a reference voltage level $R_2$, and a fourth receiver of the set of receivers may compare the voltage level of the signal to a reference voltage level $R_3$. A voltage level less than $R_0$ may correspond to symbol level 0, a voltage level between $R_0$ and $R_1$ may correspond to symbol level 1, a voltage level between $R_1$ and $R_2$ may correspond to $V_C$, a voltage level between $R_2$ and $R_3$ may correspond to symbol level 2, and a voltage level greater than $R_3$ may correspond to symbol level 3. Accordingly, the device may use the set of receivers to determine to which symbol level the voltage level of the signal corresponds or to determine that the voltage level of the signal corresponds to $V_C$.

In some examples, a device may transmit a signal at $V_C$ (e.g., drive the voltage level of a transmission line of a bus to $V_C$) to indicate a multi-bit value corresponding to one of the symbol levels. For example, a signal transmitted at $V_C$ may indicate the multi-bit value corresponding to symbol level 0 if a previously transmitted signal was transmitted at a voltage level greater than $V_C$ (e.g., $V_2$ or $V_3$). Alternatively, a signal transmitted a $V_C$ may indicate the multi-bit value corresponding to symbol level 3 if a previously transmitted signal was transmitted at a voltage level less than $V_C$ (e.g., $V_0$ or $V_1$). Accordingly, the device may drive the voltage level of the transmission line to $V_C$ rather than, for example, $V_0$ or $V_3$ to indicate the corresponding multi-bit values in conjunction with (e.g., based on) a previously transmitted signal.

In some examples, a device may transmit a signal at $V_C$ (e.g., drive the voltage level of a transmission line of a bus to $V_C$) to indicate a multi-bit value corresponding to one of the symbol levels. For example, a signal transmitted at $V_C$ may indicate the multi-bit value corresponding to symbol level 0 if a next transmitted signal is transmitted at a voltage level greater than $V_C$ (e.g., $V_2$ or $V_3$). Alternatively, a signal transmitted a $V_C$ may indicate the multi-bit value corresponding to symbol level 3 if a next transmitted signal is transmitted at a voltage level less than $V_C$ (e.g., $V_0$ or $V_1$). Accordingly, the device may drive the voltage level of the transmission line to $V_C$ rather than, for example, $V_0$ or $V_3$ to indicate the corresponding multi-bit values in conjunction with (e.g., based on) a next transmitted signal.

In some examples, a device may transmit multiple consecutive signals at a given voltage level, such as $V_C$, to indicate a same multi-bit value corresponding to one of the symbol levels for each of the consecutive signals. That is, a device may maintain the voltage level of a transmission line of a bus at a given voltage level, such as $V_C$, to transmit multiple consecutive signals, where each signal of the consecutive signals indicates the multi-bit value indicated by $V_C$. The multi-bit value indicated by the consecutive signals may be based on a signal transmitted before or after transmitting the consecutive signals at $V_C$. For example, the consecutive signals transmitted at $V_C$ may indicate the multi-bit value corresponding to symbol level 0 or symbol level 3 if a previous or a next signal is transmitted at a voltage greater than $V_C$ (e.g., $V_2$ or $V_3$) or less than $V_C$ (e.g., $V_0$ or $V_1$), respectively.

By transmitting signals at $V_C$, a device may reduce a size of a voltage level transition and a transition time associated with indicating multi-bit values. In turn, this may improve an integrity of a data signal. For example, the eye diagram 305 may be used to indicate a quality of received signals at a device and may provide a visual indication of the health and integrity of a signal. In the example of FIG. 3, the eye diagram 305 may represent a PAM4 signal used to communicate information (e.g., data, control information, address information) between a host device and a memory device, where the PAM4 signal may be transmitted at a cancellation voltage level $V_C$ to indicate a multi-bit value corresponding to one of the symbol levels 0 or 3. It is noted, however, that other eye diagrams 305 representing signals modulated according to different modulation schemes (e.g., a PAM3 scheme, a PAM8 scheme, or some other multi-symbol modulation scheme) are possible.

In some examples, the eye diagram 305 may indicate an eye opening 315, which may represent a peak-to-peak voltage difference between the voltage levels. The eye opening 315 may be related to a voltage margin for discriminating between different voltage levels. The smaller the margin, the more difficult it may be to discriminate between neighboring voltage levels, and the more errors that may be introduced due to noise. The larger the eye opening 315, the less likely it is that noise will cause the voltage level of a signal to cross a reference voltage level R (e.g., and thus be decoded improperly). The eye opening 315 may be used indicate an amount of additive noise in the signal, and may be used to determine a signal-to-noise ratio (SNR) of the signal. Various encoding and decoding techniques may be used to modify the eye opening 315 of the measured signal.

In some examples, the eye diagram 305 may indicate a width 320. The width 320 of an eye in the eye diagram 305 may be used to indicate a timing synchronization of a signal or jitter effects of the received signal. In some examples, comparing the width 320 to a sample period of the signal may provide a measurement of SNR of the signal. Each eye in an eye diagram may have a unique width based on the characteristics of the signal. Various encoding and decoding techniques may be used to modify the width 320 of the signal.

By transmitting signals at $V_C$, a device may increase a width 320 and an eye opening 315 of one or more eyes of the eye diagram, thus increasing a data eye margin and increasing a reliability of the signal, among other advantages. For example, transmitting a signal at VC may reduce a transition time between voltage levels which may increase the eye opening 315 and the width 320.

Figure 4A:
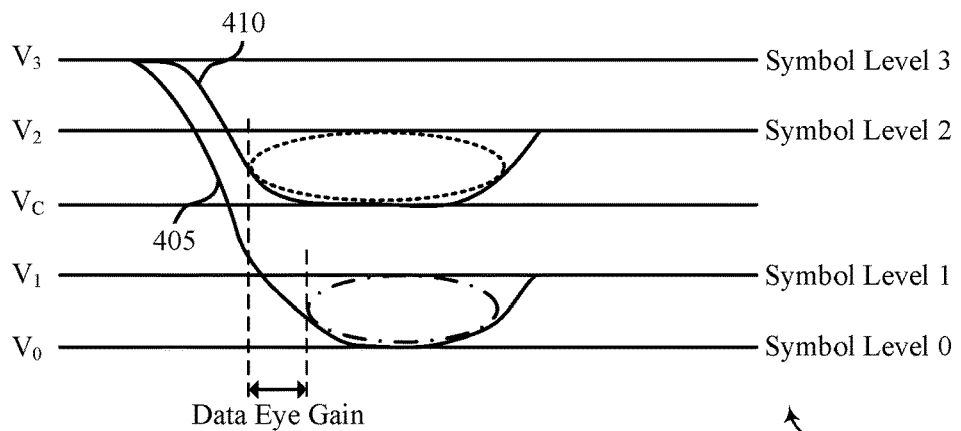
FIGS. 4A, 4B, and 4C illustrate examples of signal diagrams that support techniques for communicating multi-level signals in accordance with examples as disclosed herein.

FIG. 4A illustrates an example of a signal diagram 400-a that supports techniques for communicating multi-level signals in accordance with examples as disclosed herein. The signal diagram 400-a may be implemented by a device of a system such as a host device 105 or a memory device 110 described with reference to FIG. 1. In some examples, the signal diagram 400-a may be implemented to support improvements to latency, system performance, signal integrity, and signal reliability, among other benefits.

The signal diagram 400-a depicts voltage levels of a modulation scheme (e.g., a PAM scheme) that implements a cancellation voltage as described herein. The voltage levels may include: a first voltage level ($V_0$) corresponding to a first symbol level 0 that represents a first multi-bit value, a second voltage level ($V_1$) corresponding to a second symbol level 1 that represents a second multi-bit value, a cancellation voltage level ($V_C$), a third voltage level ($V_2$) corresponding to a third symbol level 2 that represents a third multi-bit value, and a fourth voltage level ($V_3$) corresponding to a fourth symbol level 3 that represents a fourth multi-bit value. In some examples, the signal diagram 400-a may represent a PAM4 modulation scheme implementing the cancellation voltage level $V_C$.

The signal diagram 400-a depicts example transitions between voltage levels of the modulation scheme. The transitions may represent a transition from a first voltage level of a first signal communicated between devices (e.g., between a host device 105 and a memory device 110 described with reference to FIG. 1) to a second voltage level of a second signal communicated between the devices.

For example, the signal diagram 400-a depicts a transition 405 of a first signal transmitted at $V_3$ to a second signal transmitted at $V_0$. The transition 405 may correspond to a maximum transition associated with $V_3$. That is, the transition 405 may be a transition having a largest voltage difference between $V_3$ and another voltage level of the modulation scheme (e.g., $V_1$, $V_C$, or $V_2$).

To communicate signals according to the transition 405, a first device may transmit a first signal to a second device at $V_3$ to indicate the fourth multi-bit value corresponding to symbol level 3. In some cases, the first device may drive a transmission line of a bus between the first device and the second device to $V_3$ to transmit the first signal. The first device may then transition to $V_0$ (e.g., according to transition 405) to transmit a second signal (e.g., a next signal) to the second device at $V_0$ to indicate the first multi-bit value corresponding to the symbol level 0. In some cases, the first device may drive the transmission line from $V_3$ to $V_0$ to perform the transition 405 and transmit the second signal. The second device may receive the first signal and the second signal and may decode each of the first signal and the second signal based on receiving the first signal at $V_3$ and the second signal at $V_0$. That is, the second device may determine the fourth multi-bit value indicated by the first signal based on receiving the first signal at $V_3$ and may determine the first multi-bit value indicated by the second signal based on receiving the second signal at $V_0$.

The signal diagram 400-$a$ additionally depicts a transition 410 of a first signal transmitted at $V_3$ to a second signal transmitted at $V_C$. To communicate signals according to the transition 410, the first device may transmit the first signal to the second device at $V_3$ to indicate the fourth multi-bit value corresponding to symbol level 3. In some cases, the first device may drive the transmission line of the bus to $V_3$ to transmit the first signal. The first device may then transition to $V_C$ (e.g., according to transition 405) to transmit a second signal (e.g., a next signal) to the second device at $V_C$ to indicate the first multi-bit value corresponding to the symbol level 0. In some cases, the first device may drive the transmission line from $V_3$ to $V_C$ to perform the transition 405 and transmit the second signal.

Transmitting the second signal at $V_C$ may indicate the first multi-bit value based on transmitting the first signal at $V_3$. For example, the first device and the second device may be configured such that communicating a signal at $V_C$ may indicate for the receiving device (e.g., the second device) to decode the signal based on the previously received signal (or in some alternative examples based on a next received signal). For instance, the first device and the second device may be configured such that a transition from a voltage level greater than $V_C$ (e.g., $V_3$) to $V_C$ indicates the first multi-bit value corresponding to $V_0$, which is less than $V_C$. Additionally, or alternatively, the first device and the second device may be configured such that a transition from a voltage level less than $V_C$ (e.g., $V_0$) to $V_C$ indicates the fourth multi-bit value corresponding to $V_3$, which is greater than $V_C$. In the example of FIG. 4A, because the first device transmitted the first signal at $V_3$ which is greater than $V_C$, the second signal may indicate the first multi-bit value corresponding to symbol level 0. Accordingly, the second device may receive the first signal and the second signal and may decode each of the first signal and the second signal based on receiving the first signal at $V_3$ and the second signal at $V_C$. That is, the second device may determine the fourth multi-bit value indicated by the first signal based on receiving the first signal at $V_3$ and may determine the first multi-bit value indicated by the second signal based on receiving the second signal at $V_C$ and receiving the first signal at $V_3$.

The first device may select $V_C$ for transmitting the second signal in order to reduce a size of a transition between the first signal and the second signal. For example, a first voltage difference between $V_3$ and $V_0$ may be greater (e.g., have a larger magnitude) than a second voltage difference between $V_3$ and $V_C$. Accordingly, the first device may select $V_C$ to transmit a signal, such as the second signal or in some examples a first signal that relates to a next signal, to reduce a voltage difference of the transition. In some examples, the first device may select $V_C$ based on the first voltage difference satisfying a threshold. For example, information to be transmitted by the first device may call for a transition from $V_3$ to $V_0$ (e.g., to indicate the fourth multi-bit value followed by the first multi-bit value). The first device may determine that the first voltage difference satisfies a threshold voltage difference (e.g., corresponding to a voltage difference greater than voltage difference between $V_3$ and $V_1$), select $V_C$ based on the first voltage difference satisfying the threshold, and transition to $V_C$ to indicate the first multi-bit value (e.g., rather than transitioning to $V_0$).

Although described overall that the first device may select $V_C$ for transmitting a second signal in order to reduce a size of a transition between a first signal and a second signal (e.g., transmitting the second signal using $V_C$), the present disclosure can also apply to alternative examples where the first device may select $V_C$ for transmitting a first signal in order to reduce a size of a transition between the first signal and a second signal (e.g., transmitting the first signal using $V_C$). Additionally, similar alternative examples are within the present disclosure for the second device (e.g., the receiving device that may decode the signals).

A device may communicate signals at $V_C$ to increase a data eye margin, a reliability, and a speed associated with communicating multi-bit values. For example, the transition 410 may be associated with a faster transition between voltage levels compared to the transition 405 due to second voltage difference between $V_3$ and $V_C$ being less than the first voltage difference between $V_3$ and $V_0$. This may result in a data eye gain associated with the transition 410 compared to the transition 405 due to, for example, increasing a data eye margin (e.g., increasing a data eye width, a data eye opening, or a combination thereof) associated with indicating the first multi-bit value.

For illustrative purposes, the signal diagram 400-$a$ depicts the transition 410 from $V_3$ to $V_C$ to indicate the first multi-bit value. However, a device may additionally or alternatively transition from $V_0$ to $V_C$ to indicate the fourth multi-bit value corresponding to symbol level 3. That is, $V_C$ may be used to indicate multiple multi-bit values, where the multi-bit value indicated by $V_C$ is based on whether a voltage level of a previously transmitted signal is greater than or less than $V_C$.

Figure 4B:
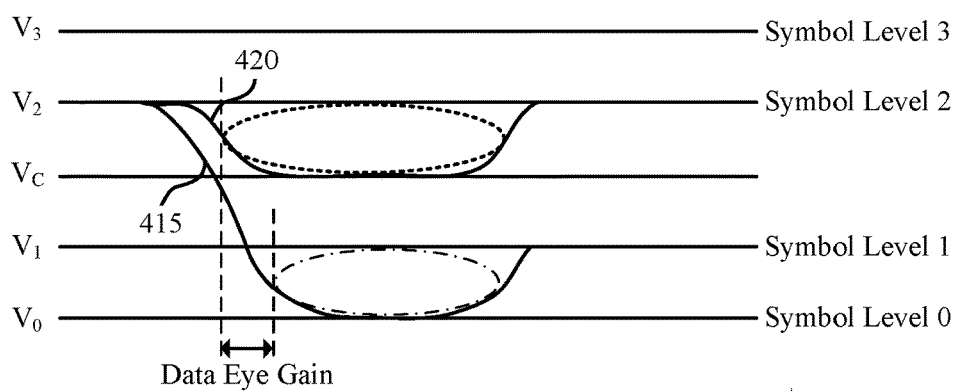

FIG. 4B illustrates an example of a signal diagram 400-$b$ that supports techniques for communicating multi-level signals in accordance with examples as disclosed herein. The signal diagram 400-$b$ may be implemented by a device of a system such as a host device 105 or a memory device 110 described with reference to FIG. 1. In some examples, the signal diagram 400-$b$ may be implemented to support improvements to latency, system performance, signal integrity, and signal reliability, among other benefits.

The signal diagram 400-$b$ depicts voltage levels of a modulation scheme (e.g., a PAM scheme) that implements a cancellation voltage as described herein. The voltage levels may include: a first voltage level ($V_0$) corresponding to a first symbol level 0 that represents a first multi-bit value, a second voltage level ($V_1$) corresponding to a second symbol level 1 that represents a second multi-bit value, a cancellation voltage level ($V_C$), a third voltage level ($V_2$) corresponding to a third symbol level 2 that represents a third multi-bit value, and a fourth voltage level ($V_3$) corresponding to a fourth symbol level 3 that represents a fourth multi-bit value. In some examples, the signal diagram 400-*b* may represent a PAM4 modulation scheme implementing the cancellation voltage level $V_C$.

The signal diagram 400-*b* depicts a transition 415 of a first signal transmitted at $V_2$ to a second signal transmitted at $V_0$. The transition 415 may correspond to a maximum transition associated with $V_2$. That is, the transition 415 may be a transition having a largest voltage difference between $V_2$ and another voltage level of the modulation scheme (e.g., $V_1$, $V_C$, or $V_3$).

To communicate signals according to the transition 415, a first device may transmit a first signal to a second device at $V_2$ (e.g., drive a transmission line of a bus between the first device and the second device to $V_2$) to indicate the third multi-bit value corresponding to symbol level 2. The first device may then transition to $V_0$ (e.g., by driving the transmission line to $V_0$) to transmit a second signal (e.g., a next signal) to the second device at $V_0$ to indicate the first multi-bit value corresponding to the symbol level 0. The second device may receive the first signal and the second signal and may decode each of the first signal and the second signal based on receiving the first signal at $V_2$ and the second signal at $V_0$.

The signal diagram 400-*a* additionally depicts a transition 420 of a first signal transmitted at $V_2$ to a second signal transmitted at $V_C$. To communicate signals according to the transition 410, the first device may transmit the first signal to the second device at $V_3$ (e.g., drive to transmission line of the bus to $V_2$) to indicate the third multi-bit value corresponding to symbol level 2. The first device may then transition to $V_C$ (e.g., by driving the transmission line of the bus to $V_C$) to transmit a second signal (e.g., a next signal) to the second device at $V_C$ to indicate the first multi-bit value corresponding to the symbol level 0.

Transmitting the second signal at $V_C$ may indicate the first multi-bit value based on transmitting the first signal at $V_2$. For instance, the first device and the second device may be configured such that a transition from a voltage level greater than $V_C$ (e.g., $V_2$) to $V_C$ indicates the first multi-bit value corresponding to $V_0$, which is less than $V_C$. Additionally, or alternatively, the first device and the second device may be configured such that a transition from a voltage level less than $V_C$ (e.g., $V_1$) to $V_C$ indicates the fourth multi-bit value corresponding to $V_3$, which is greater than $V_C$. In the example of FIG. 4B, because the first device transmitted the first signal at $V_2$, the second signal may indicate the first multi-bit value corresponding to symbol level 0. Accordingly, the second device may receive the first signal and the second signal and may decode each of the first signal and the second signal based on receiving the first signal at $V_2$ and the second signal at $V_C$. That is, the second device may determine the fourth multi-bit value indicated by the first signal based on receiving the first signal at $V_2$ and may determine the first multi-bit value indicated by the second signal based on receiving the second signal at $V_C$ and receiving the first signal at $V_2$.

In some examples, the first device may select $V_C$ for transmitting the second signal based on a first voltage difference between $V_2$ and $V_0$ satisfying a threshold. For example, the first device may determine that the first voltage difference satisfies a threshold voltage difference (e.g., corresponding to a voltage difference greater than a voltage difference between $V_2$ and $V_1$), select $V_C$ based on the first voltage difference satisfying the threshold, and transition to $V_C$ to indicate the first multi-bit value (e.g., rather than transitioning to $V_0$). This may reduce a size of a transition between the first signal and the second signal, for example, because the first voltage difference may be greater than a second voltage difference between $V_2$ and $V_C$. A transition to VC may also increase a data eye margin, a reliability, and a speed associated with communicating multi-bit values, for example, due to increasing a transition speed between voltage levels.

Although described overall that the first device may select $V_C$ for transmitting a second signal in order to reduce a size of a transition between a first signal and a second signal (e.g., transmitting the second signal using $V_C$), the present disclosure can also apply to alternative examples where the first device may select $V_C$ for transmitting a first signal in order to reduce a size of a transition between the first signal and a second signal (e.g., transmitting the first signal using $V_C$). Additionally, similar alternative examples are within the present disclosure for the second device (e.g., the receiving device that may decode the signals).

For illustrative purposes, the signal diagram 400-*b* depicts the transition 420 from $V_2$ to $V_C$ to indicate the first multi-bit value. However, a device may additionally or alternatively transition from $V_1$ to $V_C$ to indicate the fourth multi-bit value corresponding to symbol level 3. That is, $V_C$ may be used to indicate multiple multi-bit values, where the multi-bit value indicated by $V_C$ is based on whether a voltage level of a previously transmitted signal is greater than or less than $V_C$.

Figure 4C:
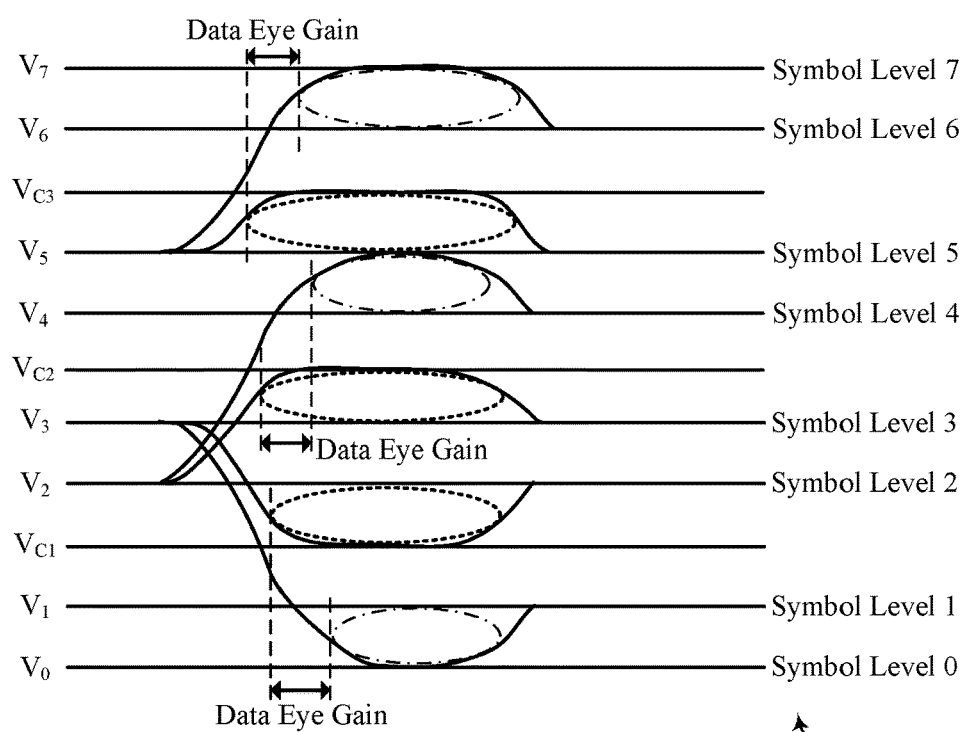

FIG. 4C illustrates an example of a signal diagram 400-*c* that supports techniques for communicating multi-level signals in accordance with examples as disclosed herein. The signal diagram 400-*c* may be implemented by a device of a system such as a host device 105 or a memory device 110 described with reference to FIG. 1. In some examples, the signal diagram 400-*c* may be implemented to support improvements to latency, system performance, signal integrity, and signal reliability, among other benefits.

The signal diagram 400-*c* depicts voltage levels of a modulation scheme (e.g., a PAM scheme) that implements multiple cancellation voltages as described herein. The voltage levels may include: a first voltage level ($V_0$) corresponding to a first symbol level 0 that represents a first multi-bit value, a second voltage level ($V_1$) corresponding to a second symbol level 1 that represents a second multi-bit value, a first cancellation voltage level ($V_{C1}$), a third voltage level ($V_2$) corresponding to a third symbol level 2 that represents a third multi-bit value, and a fourth voltage level ($V_3$) corresponding to a fourth symbol level 3 that represents a fourth multi-bit value, a second cancellation voltage level ($V_{C2}$), a fifth voltage level ($V_4$) corresponding to a fifth symbol level 4 that represents a fifth multi-bit value, a sixth voltage level ($V_5$) corresponding to a sixth symbol level 5 that represents a sixth multi-bit value, a third cancellation voltage level ($V_{C3}$), a seventh voltage level ($V_6$) corresponding to a seventh symbol level 6 that represents a seventh multi-bit value, and an eighth voltage level ($V_7$) corresponding to an eighth symbol level 7 that represents an eighth multi-bit value. In some examples, the signal diagram 400-*c* may represent a PAM8 modulation scheme implementing the cancellation voltage level $V_C$.

The signal diagram 400-*c* depicts various example transitions of a first signal transmitted at a first voltage level to a second signal transmitted at a second voltage level. A device may transmit signals at one of the cancellation voltage levels to reduce transition sizes and increase a data eye margin, a reliability, and a speed associated with communicating multi-bit values. In a first example, the device may transition from a voltage level greater than $V_{C1}$ (e.g., $V_2$, $V_3$, $V_{C2}$, $V_4$, $V_5$, $V_6$, $V_{C3}$, or $V_7$) to $V_{C1}$ to indicate the first multi-bit value rather than transitioning to $V_0$ to indicate the first multi-bit value. Additionally or alternatively, the device may transition from a voltage level less than $V_{C1}$ (e.g., $V_0$, $V_1$) to $V_{C1}$ to indicate the fourth multi-bit value rather than transitioning to $V_3$ to indicate the fourth multi-bit value.

In a second example, the device may transition from a voltage level less than $V_{C2}$ (e.g., $V_0$, $V_1$, $V_2$, $V_{C1}$, or $V_3$) to $V_{C2}$ to indicate the sixth multi-bit value rather than transitioning to $V_5$ to indicate the sixth multi-bit value. Additionally or alternatively, the device may transition from a voltage level greater than $V_{C2}$ (e.g., $V_4$, $V_5$, $V_6$, $V_{C3}$, or $V_7$) to $V_{C2}$ to indicate third multi-bit value rather than transitioning to $V_2$ to indicate the third multi-bit value.

In a third example, the device may transition from a voltage level less than $V_{C3}$ (e.g., $V_0$, $V_1$, $V_2$, $V_{C1}$, $V_3$, $V_{C2}$, $V_4$, or $V_5$) to $V_{C3}$ to indicate the eighth multi-bit value rather than transitioning to $V_7$ to indicate the eighth multi-bit value. Additionally or alternatively, the device may transition from a voltage level greater than $V_{C3}$ (e.g., $V_6$ or $V_7$) to $V_{C3}$ to indicate fifth multi-bit value rather than transitioning to $V_4$ to indicate the fifth multi-bit value.

In any example, a receiving device (e.g., a host device, a memory device) may decode a signal transmitted at one of $V_{C1}$, $V_{C2}$, or $V_{C3}$ based on a voltage level of a previously transmitted signal. For example, the receiving device may decode, based on the voltage level of the previously transmitted signal, a signal transmitted at $V_{C1}$ to determine either the first multi-bit value or the fourth multi-bit value, a signal transmitted at $V_{C2}$ to determine either the third multi-bit value or the sixth multi-bit value, and a signal transmitted at $V_{C3}$ to determine either the fifth multi-bit value or the eighth multi-bit value.

Although described overall that the first device may select $V_{C1}$, $V_{C2}$, or $V_{C3}$ for transmitting a second signal in order to reduce a size of a transition between a first signal and a second signal (e.g., transmitting the second signal using $V_{C1}$, $V_{C2}$, or $V_{C3}$), the present disclosure can also apply to alternative examples where the first device may select $V_{C1}$, $V_{C2}$, or $V_{C3}$ for transmitting a first signal in order to reduce a size of a transition between the first signal and a second signal (e.g., transmitting the first signal using $V_{C1}$, $V_{C2}$, or $V_{C3}$). Additionally, similar alternative examples are within the present disclosure for the second device (e.g., the receiving device that may decode the signals).

It is noted that, for illustrative purposes, FIG. 4C depicts the signal diagram 400-c as including three cancellation voltage levels and eight symbol levels, however the principles disclosed herein may be adapted and applied to support a modulation scheme including any quantity of cancellation voltage levels and symbol levels, where the cancellation voltage levels may be used to indicate any combination of associated symbol levels.

Figure 5:
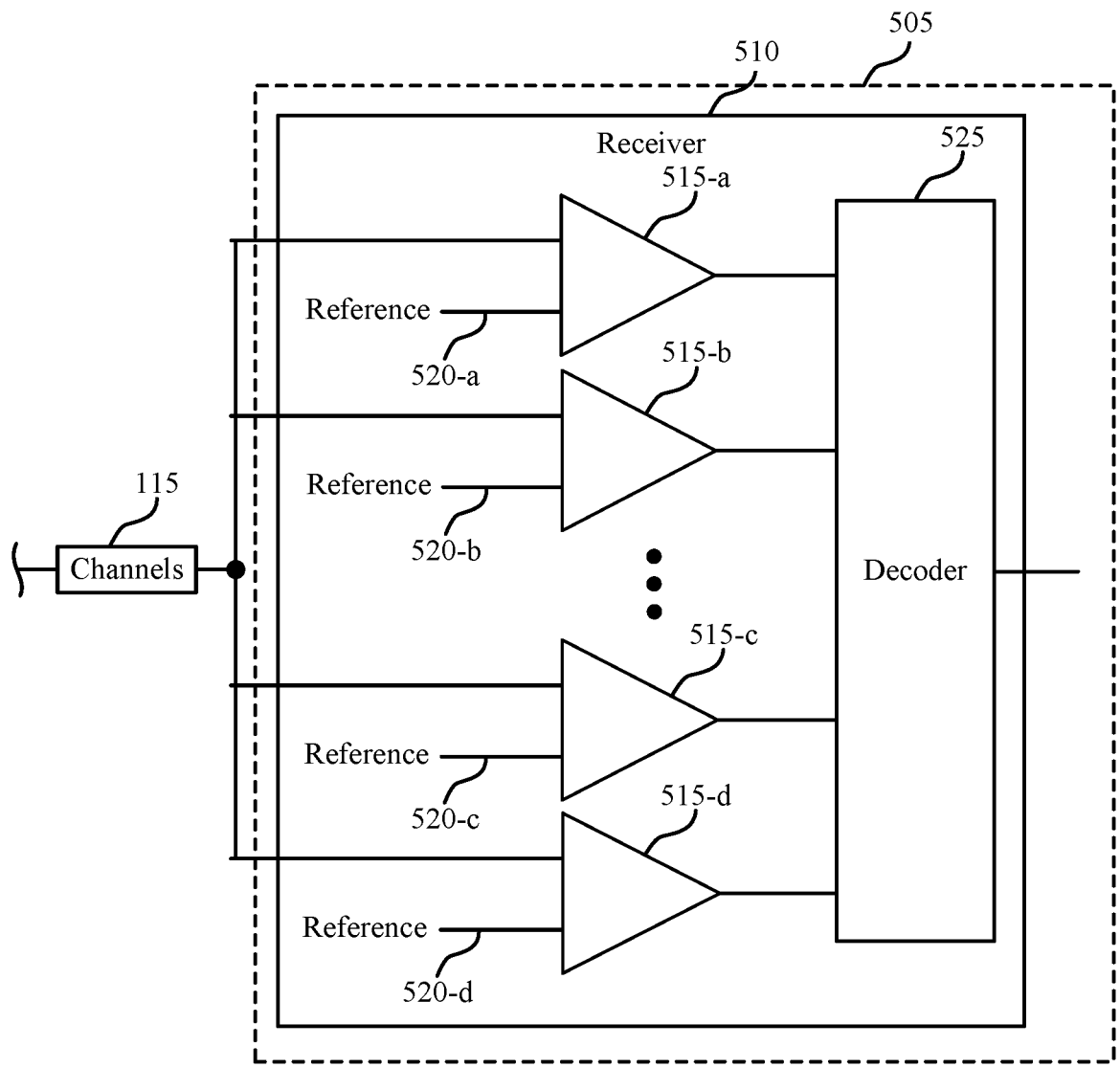
FIG. 5 illustrates an example of a system that supports techniques for communicating multi-level signals in accordance with examples as disclosed herein.

FIG. 5 illustrates an example of a system 500 that supports techniques for communicating multi-level signals in accordance with examples as disclosed herein. The system 500 may implement aspects of the system 100 or may be implemented by aspects of the system 100 described with reference to FIG. 1. For example, the system 500 may include a device 505 which may be an example of a host device 105 or a memory device 110 as described with reference to FIG. 1. The device 505 may include a receiver 510 which may be configured to receive and/or decode a multi-level signal. For example, the receiver 510 may receive a signal using one or more channels (e.g., channels 115 described with reference to FIG. 1). In some examples, the receiver 510 may be included in or coupled with a controller of the device 505 such as an external memory controller 120, a device memory controller 155, or a local memory controller 165 described with reference to FIG. 1. The device 505 may support the communication of multi-level signals using cancellation voltage levels to reduce latency and increase system performance, signal integrity, and signal reliability, among other benefits.

The receiver 510 may include a set of comparators 515 (which, in some examples, may each be referred to as a receiver) and a decoder 525. The set of comparators 515 may be configured to compare a received signal to a set of reference voltages 520. A quantity of comparators 515 included in the receiver 510 may be related to a quantity of symbol levels (e.g., multi-bit values) that may be represented in the received signal and a quantity of cancellation voltage levels implemented by a modulation scheme used to modulate the received signal. For example, if the received signal is a multi-level signal that may correspond to one of four symbol levels (e.g., a PAM4 signal) and the modulation scheme implements one cancellation voltage level (e.g., for a total of five related voltage levels), the receiver 510 may include four comparators 515-a, 515-b, 515-c, and 515-d and voltage sources providing four reference voltages 520-a, 520-b, 520-c, and 520-d. In another example, if the received signal is a multi-level signal that may correspond to one of eight symbol levels (e.g., a PAM8 signal) and the modulation scheme implements two cancellation voltage levels (e.g., for a total of ten related voltage levels), the receiver 510 may include nine comparators 515 and voltage sources providing nine reference voltages 520.

Each comparator 515 may output a signal based on whether the received signal is greater than or less than the reference voltage 520. Said another way, a comparator 515 may determine whether the received signal satisfies a voltage threshold defined by the comparator 515 and its associated reference voltage 520. For example, the comparator 515 may output a high voltage if the received signal is greater than the associated reference signal 520 and a low voltage if the received signal is less than the associated reference signal 520 (or vice-versa). The decoder 525 may receive the outputs of the comparators 515. The reference voltages 520 may be selected to discriminate between the configured voltage levels of the modulation scheme. For example, reference voltages 520 may be selected to be within an eye opening of a data eye between two voltage levels in an eye diagram (e.g., an eye opening 315 between amplitudes $V_C$ and $V_2$, as described with reference to FIG. 3).

The decoder 525 may be configured to determine a multi-bit value indicated by the received signal based on the outputs of the comparators 515. The combination of the outputs of the comparators 515 may be used to determine a voltage level of the received signal, which may indicate the multi-bit value. For example, if the decoder 525 determines that the voltage level corresponds to a voltage level other than a cancellation voltage level, the decoder 525 may determine that the received signal indicates a multi-bit value corresponding to a symbol level associated with the voltage level. Alternatively, if the decoder 525 determines that the voltage level corresponds to a cancellation voltage level, the may determine multi-bit value indicated by the multi-bit value based on a voltage level of a previously received signal. In some examples, the receiver 510 (e.g., the decoder 525) may include logic that tracks (e.g., stores) the voltage level of the previously transmitted signal in order to decode signals received at one or more cancellation voltage levels.

In some examples, the decoder 525 may output the determined multi-bit value to a controller of the device 505.

Figure 6:
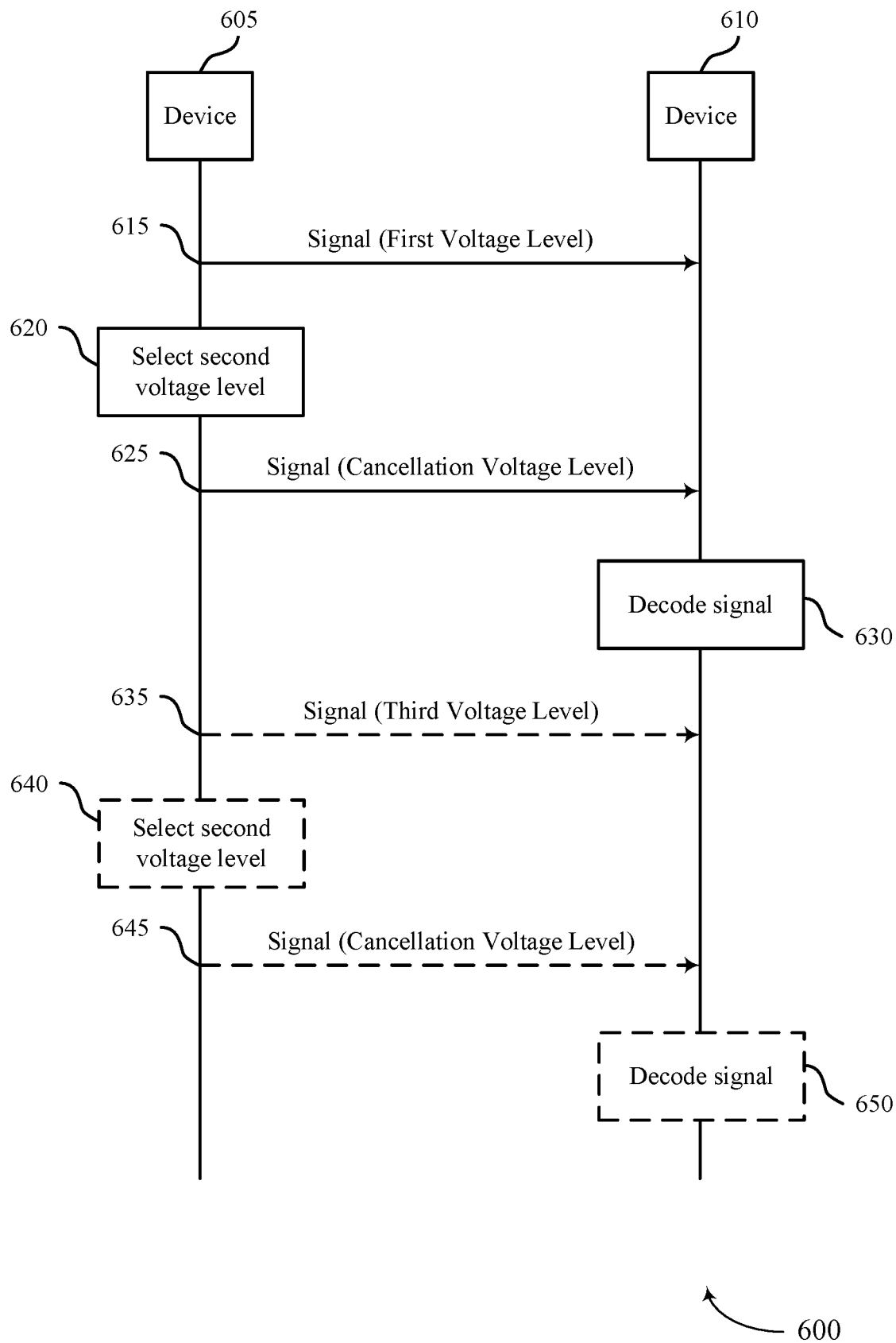
FIG. 6 illustrates an example of a process flow that supports techniques for communicating multi-level signals in accordance with examples as disclosed herein.

FIG. 6 illustrates an example of a process flow 600 that supports techniques for communicating multi-level signals in accordance with examples as disclosed herein. Process flow 600 may be performed by components of a system described with reference to FIGS. 1 and 5. For example, process flow 600 may be performed by a device 605 and a device 610 which may be examples of a host device 105, a memory device 110, or a device 505 as respectively described with reference to FIGS. 1 and 5. Process flow 600 may depict a process for communicating a signal at a cancellation voltage level to reduce voltage level transition sizes. Process flow 600 may be implemented to increase reliability and system speed, among other benefits.

In the following description of the process flow 600, the operations may be performed in different orders or at different times. Some operations may also be omitted from the process flow 600, and other operations may be added to the process flow 600.

At 615, the device 605 may transmit, to the device 610, a first signal at a first voltage level of a modulation scheme (e.g., a PAM scheme) that includes at least three voltage levels. The first voltage level may correspond to a first multi-bit value. The device 610 may receive the first signal and decode the first signal to determine the first multi-bit value based on receiving the first signal at the first voltage level.

At 620, the device 605 may select a cancellation voltage level of the modulation scheme to transmit a second signal to the device 610. In some examples, the device 605 may select the cancellation voltage level based on a second multi-bit value to be indicated by the second signal. For example, if a voltage difference between the first voltage level and a second voltage level of the modulation scheme corresponding to the second multi-bit value satisfies a threshold, the device 605 may select the cancellation voltage level to transmit the second signal and indicate the second multi-bit value. Here, a voltage difference between the first voltage level and the cancellation voltage level may be less than the voltage difference between the first voltage level and the second voltage level. In some examples, the first voltage level is greater than the cancellation voltage level and the second voltage level is less than the cancellation voltage level. In some other examples, the first voltage level is less than the cancellation voltage level and the second voltage level is greater than the cancellation voltage level.

At 625, the device 605 may transmit, based on transmitting the first signal at the first voltage level, the second signal at the cancellation voltage level to indicate the second multi-bit value to the device 610.

At 630, the device 610 may receive the second signal and decode the second signal to determine the second multi-bit value. The device 610 may decode the second signal based on receiving the first signal at the first voltage level and the second signal at the second voltage level. For example, the device 610 may determine the second multi-bit value based on whether the first voltage level is greater than or less than the cancellation voltage level.

At 635, the device 605 may optionally transmit a third signal at a third voltage level of the modulation scheme to the device 610. The third voltage level may correspond to a third multi-bit value. The device 610 may receive the third signal and may decode the third signal to determine the third multi-bit value based on receiving the third signal at the third voltage level.

At 640, the device 605 may optionally select a cancellation voltage level of the modulation scheme (e.g., a same cancellation voltage level, a different cancellation voltage level) to transmit a fourth signal to the device 610. In some examples, the device 605 may select the cancellation voltage level based on a fourth multi-bit value to be indicated by the fourth signal. For example, if a voltage difference between the third voltage level and a fourth voltage level of the modulation scheme corresponding to the fourth multi-bit value satisfies a threshold, the device 605 may select the cancellation voltage level to transmit the fourth signal and indicate the fourth multi-bit value. Here, a voltage difference between the third voltage level and the cancellation voltage level may be less than the voltage difference between the third voltage level and the fourth voltage level. In some examples, the third voltage level is greater than the cancellation voltage level and the fourth voltage level is less than the cancellation voltage level. In some other examples, the third voltage level is less than the cancellation voltage level and the fourth voltage level is greater than the cancellation voltage level At 645, the device 605 may optionally transmit, based on transmitting the third signal at the third voltage level, the fourth signal at the cancellation voltage level to indicate the fourth multi-bit value to the device 610.

At 650, the device 610 may optionally receive the fourth signal and decode the fourth signal to determine the fourth multi-bit value. The device 610 may decode the fourth signal based on receiving the third signal at the third voltage level and the fourth signal at the fourth voltage level. For example, the device 610 may determine the fourth multi-bit value based on whether the third voltage level is greater than or less than the cancellation voltage level.

Additionally or alternatively, at 620, the device 605 may select a cancellation voltage level of the modulation scheme to transmit a second signal to the device 610. In some examples, the device 605 may select the cancellation voltage level based on a second multi-bit value to be indicated by the second signal. For example, if a voltage difference between a third voltage level and a second voltage level of the modulation scheme corresponding to the second multi-bit value satisfies a threshold, the device 605 may select the cancellation voltage level to transmit the second signal and indicate the second multi-bit value. Here, a voltage difference between the third voltage level and the cancellation voltage level may be less than the voltage difference between the third voltage level and the second voltage level. In some examples, the third voltage level is greater than the cancellation voltage level and the second voltage level is less than the cancellation voltage level. In some other examples, the third voltage level is less than the cancellation voltage level and the second voltage level is greater than the cancellation voltage level.

At 625, the device 605 may transmit, the second signal at the cancellation voltage level to indicate the second multi-bit value to the device 610.

At 630, the device 610 may receive the second signal and, in this example, may refrain from decoding the second signal to determine the second multi-bit value until it receives a third signal (e.g., a next signal after the second signal). At 635, the device 605 may transmit the third signal at a third voltage level of the modulation scheme to the device 610. The third voltage level may correspond to a third multi-bit value. The device 610 may receive the third signal and may decode the third signal to determine the third multi-bit value based on receiving the third signal at the third voltage level.

The device 610 may decode the second signal based on receiving a third signal at the third voltage level at 635 and the second signal at the second voltage level. For example, the device 610 may determine the second multi-bit value based on whether the third voltage level is greater than or less than the cancellation voltage level.

Figure 7:
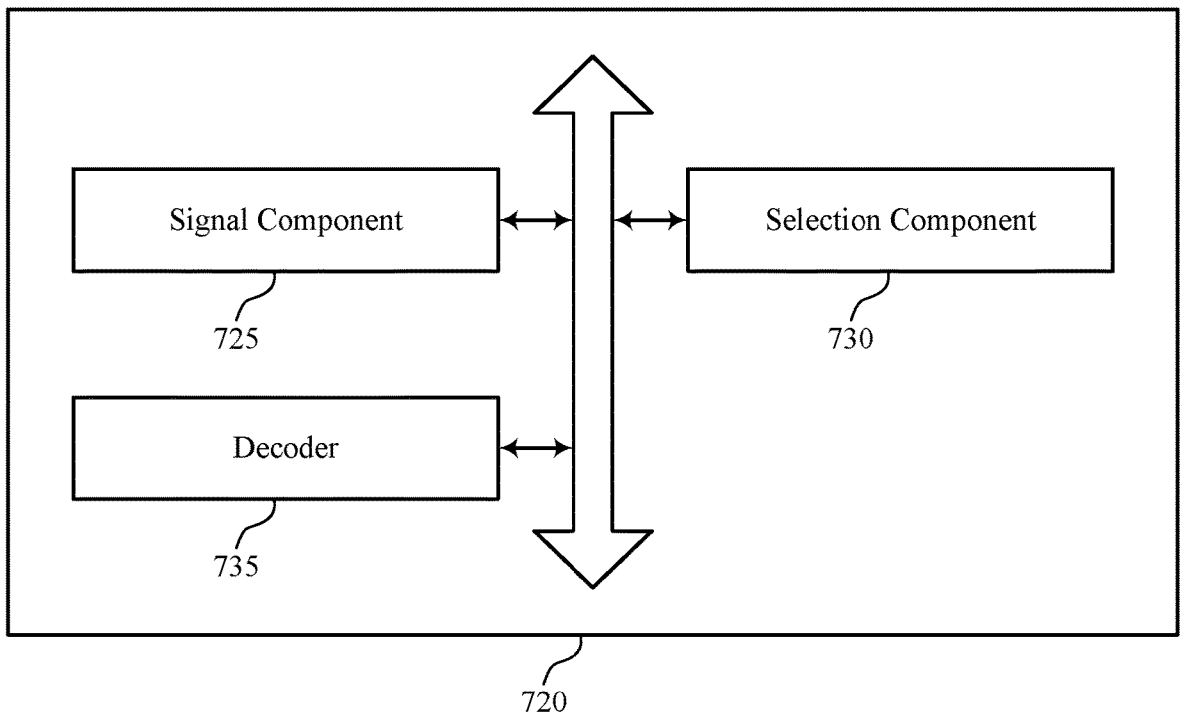
FIG. 7 shows a block diagram of a device that supports techniques for communicating multi-level signals in accordance with examples as disclosed herein.

FIG. 7 shows a block diagram 700 of a device 720 that supports techniques for communicating multi-level signals in accordance with examples as disclosed herein. The device 720 may be an example of aspects of a device as described with reference to FIGS. 1 through 6. The device 720, or various components thereof, may be an example of means for performing various aspects of techniques for communicating multi-level signals as described herein. For example, the device 720 may include a signal component 725, a selection component 730, a decoder 735, or any combination thereof. Each of these components may communicate, directly or indirectly, with one another (e.g., via one or more buses).

The signal component 725 may be configured as or otherwise support a means for transmitting, from the device to a second device, a first signal at a first voltage level of a PAM scheme including three or more voltage levels, the first voltage level corresponding to a first multi-bit value. The selection component 730 may be configured as or otherwise support a means for selecting, at the device, a second voltage level of the PAM scheme based at least in part on a first voltage difference between the first voltage level and a third voltage level of the PAM scheme that corresponds to a second multi-bit value being greater than a threshold, the second voltage level indicating the second multi-bit value and having a second voltage difference from the first voltage level that is less than the first voltage difference. In some examples, the signal component 725 may be configured as or otherwise support a means for transmitting, from the device to the second device based at least in part on transmitting the first signal at the first voltage level, a second signal at the second voltage level, the second voltage level indicating the second multi-bit value corresponding to the third voltage level.

In some examples, transmitting the second signal at the second voltage level indicates for the second device to determine the second multi-bit value based at least in part on the first voltage level.

In some examples, the second signal is transmitted at the second voltage level as a next signal after transmitting the first signal at the first voltage level.

In some examples, the signal component 725 may be configured as or otherwise support a means for transmitting, from the device to the second device, a third signal at a fourth voltage level of the PAM scheme, the fourth voltage level corresponding to a third multi-bit value. In some examples, the selection component 730 may be configured as or otherwise support a means for selecting, at the device, the second voltage level of the PAM scheme for transmission of a fourth signal based at least in part on a third voltage difference between the fourth voltage level and a fifth voltage level of the PAM scheme that corresponds to a fourth multi-bit value being greater than a second threshold, the second voltage level indicating the fourth multi-bit value and having a fourth voltage difference from the fourth voltage level that is less than the third voltage difference. In some examples, the signal component 725 may be configured as or otherwise support a means for transmitting, from the device to the second device, the fourth signal at the second voltage level of the PAM scheme, the second voltage level indicating the fourth multi-bit value corresponding to the fifth voltage level based at least in part on transmitting the third signal at the fourth voltage level.

In some examples, the first voltage level and the fifth voltage level are greater than the second voltage level. In some examples, the third voltage level and the fourth voltage level are less than the second voltage level.

In some examples, the first voltage level and the fifth voltage level are less than the second voltage level. In some examples, the third voltage level and the fourth voltage level are greater than the second voltage level.

In some examples, the first voltage level is greater than the second voltage level and the third voltage level is less than the second voltage level.

In some examples, the first voltage level is less than the second voltage level and the third voltage level is greater than the second voltage level.

In some examples, the second voltage level is a ground voltage level.

In some examples, the device includes a host device and the second device includes a memory device.

In some examples, the device includes a memory device and the second device includes a host device.

In some examples, the signal component 725 may be configured as or otherwise support a means for receiving, at the device from a second device, a first signal at a first voltage level of a PAM scheme including three or more voltage levels, the first voltage level corresponding to a first multi-bit value. In some examples, the signal component 725 may be configured as or otherwise support a means for receiving, at the device from the second device, a second signal at a second voltage level of the PAM scheme, the second voltage level indicating a second multi-bit value that corresponds to a third voltage level of the PAM scheme based at least in part on receiving the first signal at the first voltage level. The decoder 735 may be configured as or otherwise support a means for decoding, at the device, the second signal to determine the second multi-bit value based at least in part on receiving the first signal at the first voltage level and the second signal at the second voltage level, a first voltage difference between the first voltage level and the third voltage level being greater than a second voltage difference between the first voltage level and the second voltage level.

In some examples, receiving the second signal at the second voltage level indicates for the device to decode the second signal based at least in part on the first voltage level.

In some examples, the second signal is received at the second voltage level as a next signal after receiving the first signal at the first voltage level.

In some examples, the signal component 725 may be configured as or otherwise support a means for receiving, at the device from the second device, a third signal at a fourth voltage level of the PAM scheme, the fourth voltage level corresponding to a third multi-bit value. In some examples, the signal component 725 may be configured as or otherwise support a means for receiving, at the device from the second device, a fourth signal at the second voltage level, the second voltage level indicating a fourth multi-bit value that corresponds to a fifth voltage level of the PAM scheme based at least in part on receiving the third signal at the fourth voltage level. In some examples, the decoder 735 may be configured as or otherwise support a means for decoding, at the device, the fourth signal to determine the fourth multi-bit value based at least in part on receiving the third signal at the fourth voltage level and the fourth signal at the second voltage level, a third voltage difference between the fourth voltage level and the fifth voltage level being greater than a fourth voltage difference between the fourth voltage level and the second voltage level.

In some examples, the first voltage level and the fifth voltage level are greater than the second voltage level. In some examples, the third voltage level and the fourth voltage level are less than the second voltage level.

In some examples, the first voltage level and the fifth voltage level are less than the second voltage level. In some examples, the third voltage level and the fourth voltage level are greater than the second voltage level.

In some examples, the second signal is received at the second voltage level based at least in part on the first voltage difference satisfying a threshold.

In some examples, the first voltage level is greater than the second voltage level and the third voltage level is less than the second voltage level.

In some examples, the first voltage level is less than the second voltage level and the third voltage level is greater than the second voltage level.

In some examples, the second voltage level is a ground voltage level.

In some examples, the first device includes a host device and the second device includes a memory device.

In some examples, the first device includes a memory device and the second device includes a host device.

Figure 8:
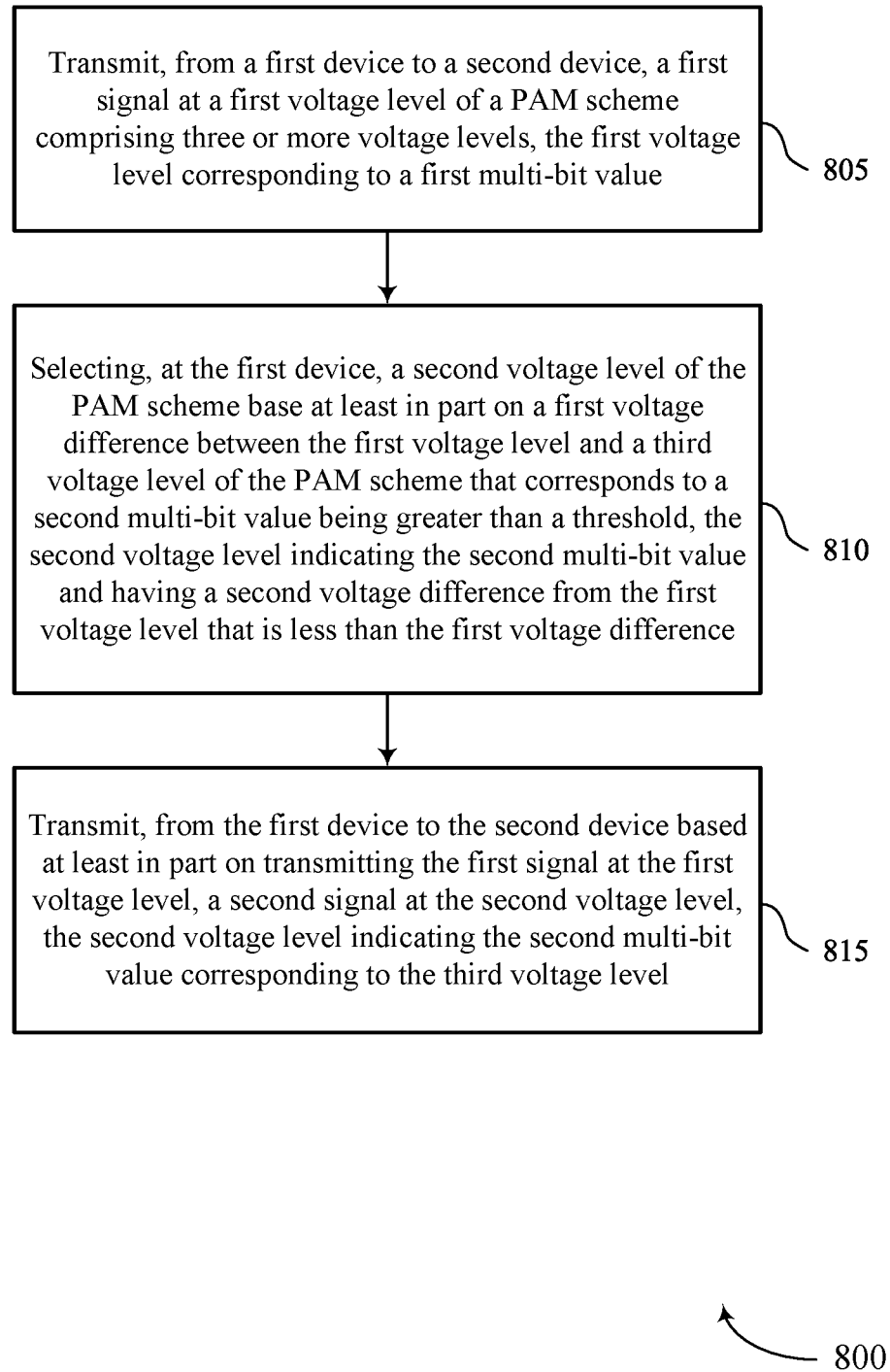
FIGS. 8 and 9 show flowcharts illustrating a method or methods that support techniques for communicating multi-level signals in accordance with examples as disclosed herein.

FIG. 8 shows a flowchart illustrating a method 800 that supports techniques for communicating multi-level signals in accordance with examples as disclosed herein. The operations of method 800 may be implemented by a device or its components as described herein. For example, the operations of method 800 may be performed by a device as described with reference to FIGS. 1 through 7. In some examples, a device may execute a set of instructions to control the functional elements of the device to perform the described functions. Additionally or alternatively, the device may perform aspects of the described functions using special-purpose hardware.

At 805, the method may include transmitting, from a first device to a second device, a first signal at a first voltage level of a PAM scheme including three or more voltage levels, the first voltage level corresponding to a first multi-bit value. The operations of 805 may be performed in accordance with examples as described with reference to FIGS. 3-6. In some examples, aspects of the operations of 805 may be performed by a signal component 725 as described with reference to FIG. 7.

At 810, the method may include selecting, at the first device, a second voltage level of the PAM scheme based at least in part on a first voltage difference between the first voltage level and a third voltage level of the PAM scheme that corresponds to a second multi-bit value being greater than a threshold, the second voltage level indicating the second multi-bit value and having a second voltage difference from the first voltage level that is less than the first voltage difference. The operations of 810 may be performed in accordance with examples as described with reference to FIGS. 3-6. In some examples, aspects of the operations of 810 may be performed by a selection component 730 as described with reference to FIG. 7.

At 815, the method may include transmitting, from the first device to the second device based at least in part on transmitting the first signal at the first voltage level, a second signal at the second voltage level, the second voltage level indicating the second multi-bit value corresponding to the third voltage level. The operations of 815 may be performed in accordance with examples as described with reference to FIGS. 3-6. In some examples, aspects of the operations of 815 may be performed by a signal component 725 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor) for transmitting, from a first device to a second device, a first signal at a first voltage level of a PAM scheme including three or more voltage levels, the first voltage level corresponding to a first multi-bit value, selecting, at the first device, a second voltage level of the PAM scheme based at least in part on a first voltage difference between the first voltage level and a third voltage level of the PAM scheme that corresponds to a second multi-bit value being greater than a threshold, the second voltage level indicating the second multi-bit value and having a second voltage difference from the first voltage level that is less than the first voltage difference, and transmitting, from the first device to the second device based at least in part on transmitting the first signal at the first voltage level, a second signal at the second voltage level, the second voltage level indicating the second multi-bit value corresponding to the third voltage level.

In some examples of the method 800 and the apparatus described herein, transmitting the second signal at the second voltage level indicates for the second device to determine the second multi-bit value based at least in part on the first voltage level.

In some examples of the method 800 and the apparatus described herein, the second signal may be transmitted at the second voltage level as a next signal after transmitting the first signal at the first voltage level.

Some examples of the method 800 and the apparatus described herein may further include operations, features, circuitry, logic, means, or instructions for transmitting, from the first device to the second device, a third signal at a fourth voltage level of the PAM scheme, the fourth voltage level corresponding to a third multi-bit value, selecting, at the first device, the second voltage level of the PAM scheme for transmission of a fourth signal based at least in part on a third voltage difference between the fourth voltage level and a fifth voltage level of the PAM scheme that corresponds to a fourth multi-bit value being greater than a second threshold, the second voltage level indicating the fourth multi-bit value and having a fourth voltage difference from the fourth voltage level that may be less than the third voltage difference, and transmitting, from the first device to the second device, the fourth signal at the second voltage level of the PAM scheme, the second voltage level indicating the fourth multi-bit value corresponding to the fifth voltage level based at least in part on transmitting the third signal at the fourth voltage level.

In some examples of the method 800 and the apparatus described herein, the first voltage level and the fifth voltage level may be greater than the second voltage level and the third voltage level and the fourth voltage level may be less than the second voltage level.

In some examples of the method 800 and the apparatus described herein, the first voltage level and the fifth voltage level may be less than the second voltage level and the third voltage level and the fourth voltage level may be greater than the second voltage level.

In some examples of the method 800 and the apparatus described herein, the first voltage level may be greater than the second voltage level and the third voltage level may be less than the second voltage level.

In some examples of the method 800 and the apparatus described herein, the first voltage level may be less than the second voltage level and the third voltage level may be greater than the second voltage level.

In some examples of the method 800 and the apparatus described herein, the second voltage level may be a ground voltage level.

In some examples of the method 800 and the apparatus described herein, the first device includes a host device and the second device includes a memory device.

In some examples of the method 800 and the apparatus described herein, the first device includes a memory device and the second device includes a host device.

Figure 9:
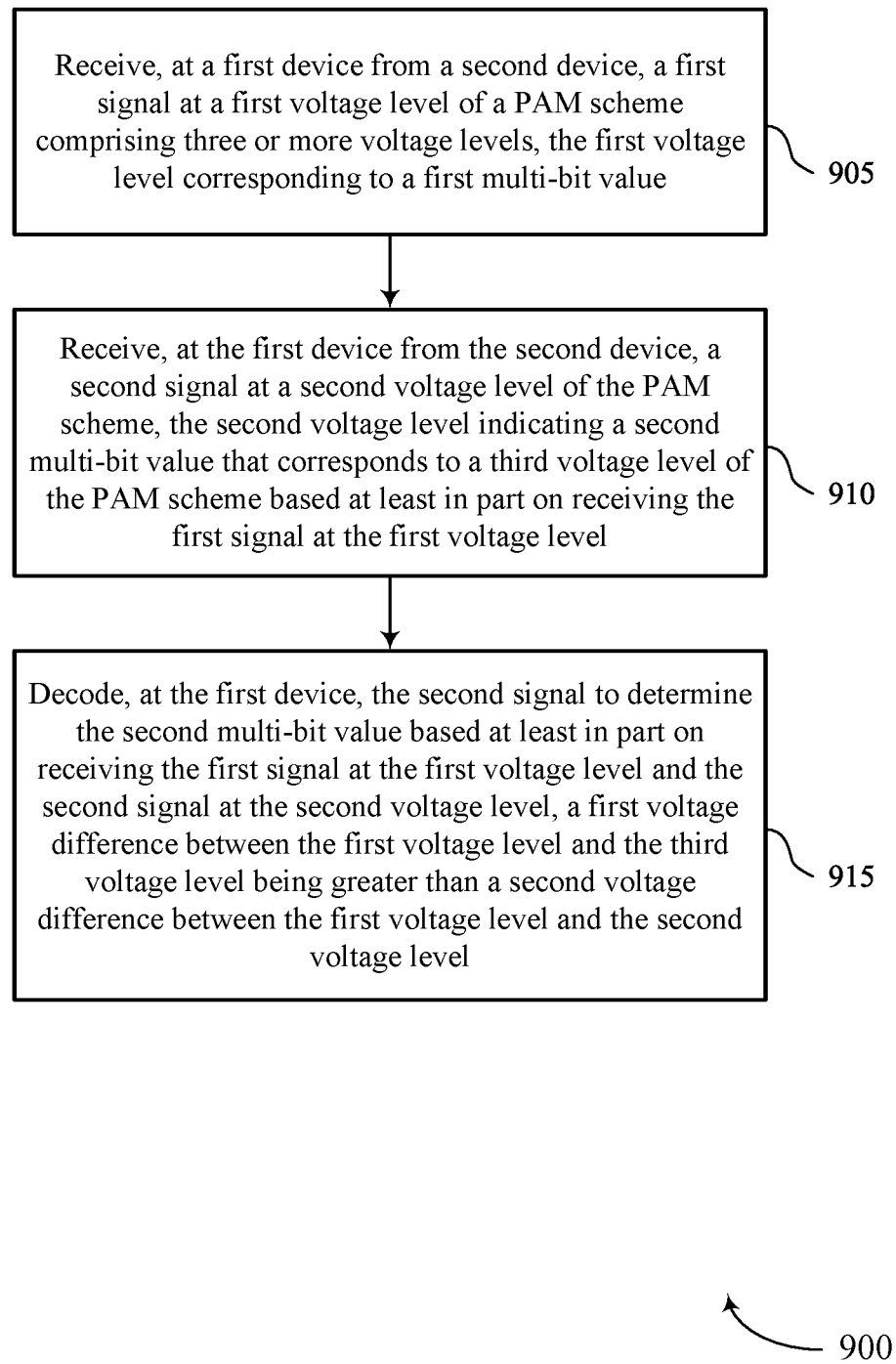

FIG. 9 shows a flowchart illustrating a method 900 that supports techniques for communicating multi-level signals in accordance with examples as disclosed herein. The operations of method 900 may be implemented by a device or its components as described herein. For example, the operations of method 900 may be performed by a device as described with reference to FIGS. 1 through 7. In some examples, a device may execute a set of instructions to control the functional elements of the device to perform the described functions. Additionally or alternatively, the device may perform aspects of the described functions using special-purpose hardware.

At 905, the method may include receiving, at a first device from a second device, a first signal at a first voltage level of a PAM scheme including three or more voltage levels, the first voltage level corresponding to a first multi-bit value. The operations of 905 may be performed in accordance with examples as described with reference to FIGS. 3-6. In some examples, aspects of the operations of 905 may be performed by a signal component 725 as described with reference to FIG. 7.

At 910, the method may include receiving, at the first device from the second device, a second signal at a second voltage level of the PAM scheme, the second voltage level indicating a second multi-bit value that corresponds to a third voltage level of the PAM scheme based at least in part on receiving the first signal at the first voltage level. The operations of 910 may be performed in accordance with examples as described with reference to FIGS. 3-6. In some examples, aspects of the operations of 910 may be performed by a signal component 725 as described with reference to FIG. 7.

At 915, the method may include decoding, at the first device, the second signal to determine the second multi-bit value based at least in part on receiving the first signal at the first voltage level and the second signal at the second voltage level, a first voltage difference between the first voltage level and the third voltage level being greater than a second voltage difference between the first voltage level and the second voltage level. The operations of 915 may be performed in accordance with examples as described with reference to FIGS. 3-6. In some examples, aspects of the operations of 915 may be performed by a decoder 735 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving, at a first device from a second device, a first signal at a first voltage level of a PAM scheme including three or more voltage levels, the first voltage level corresponding to a first multi-bit value, receiving, at the first device from the second device, a second signal at a second voltage level of the PAM scheme, the second voltage level indicating a second multi-bit value that corresponds to a third voltage level of the PAM scheme based at least in part on receiving the first signal at the first voltage level, and decoding, at the first device, the second signal to determine the second multi-bit value based at least in part on receiving the first signal at the first voltage level and the second signal at the second voltage level, a first voltage difference between the first voltage level and the third voltage level being greater than a second voltage difference between the first voltage level and the second voltage level.

In some examples of the method 900 and the apparatus described herein, receiving the second signal at the second voltage level indicates for the first device to decode the second signal based at least in part on the first voltage level.

In some examples of the method 900 and the apparatus described herein, the second signal may be received at the second voltage level as a next signal after receiving the first signal at the first voltage level.

Some examples of the method 900 and the apparatus described herein may further include operations, features, circuitry, logic, means, or instructions for receiving, at the first device from the second device, a third signal at a fourth voltage level of the PAM scheme, the fourth voltage level corresponding to a third multi-bit value, receiving, at the first device from the second device, a fourth signal at the second voltage level, the second voltage level indicating a fourth multi-bit value that corresponds to a fifth voltage level of the PAM scheme based at least in part on receiving the third signal at the fourth voltage level, and decoding, at the first device, the fourth signal to determine the fourth multi-bit value based at least in part on receiving the third signal at the fourth voltage level and the fourth signal at the second voltage level, a third voltage difference between the fourth voltage level and the fifth voltage level being greater than a fourth voltage difference between the fourth voltage level and the second voltage level.

In some examples of the method 900 and the apparatus described herein, the first voltage level and the fifth voltage level may be greater than the second voltage level and the third voltage level and the fourth voltage level may be less than the second voltage level.

In some examples of the method 900 and the apparatus described herein, the first voltage level and the fifth voltage level may be less than the second voltage level and the third voltage level and the fourth voltage level may be greater than the second voltage level.

In some examples of the method 900 and the apparatus described herein, the second signal may be received at the second voltage level based at least in part on the first voltage difference satisfying a threshold.

In some examples of the method 900 and the apparatus described herein, the first voltage level may be greater than the second voltage level and the third voltage level may be less than the second voltage level.

In some examples of the method 900 and the apparatus described herein, the first voltage level may be less than the second voltage level and the third voltage level may be greater than the second voltage level.

In some examples of the method 900 and the apparatus described herein, the second voltage level may be a ground voltage level.

In some examples of the method 900 and the apparatus described herein, the first device includes a host device and the second device includes a memory device.

In some examples of the method 900 and the apparatus described herein, the first device includes a memory device and the second device includes a host device.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a transmission line of a bus, a set of receivers coupled with the transmission line, each receiver of the set of receivers configured to compare a first voltage level of the transmission line with a reference voltage level associated with the receiver, and a decoder coupled with the set of receivers and configured to determine a first PAM symbol level indicated by the first voltage level based at least in part on comparing the first voltage level to a plurality of the reference voltage levels, the first voltage level indicating the first PAM symbol level based at least in part on a second voltage level of the transmission line corresponding to a second PAM symbol level.

In some examples of the apparatus, the first PAM symbol level corresponds to a third voltage level of the transmission line different than the first voltage level.

In some examples of the apparatus, the first voltage level indicating the first PAM symbol level may be based at least in part on a voltage level of the transmission line transitioning from the second voltage level to the first voltage level.

In some examples of the apparatus, the decoder may be further configured to determine a third PAM symbol level indicated by the first voltage level based at least in part on a third voltage level of the transmission line corresponding to a fourth PAM symbol level.

In some examples of the apparatus, the first voltage level indicating the third PAM symbol level may be based at least in part on a voltage level of the transmission line transitioning from the third voltage level to the first voltage level.

In some examples of the apparatus, the set of receivers includes at least four receivers, each receiver of the at least four receivers associated with a different reference voltage level of the plurality of the reference voltage levels and the first voltage level may be greater than a first reference voltage level associated with a first receiver and less than a second reference voltage level associated with a second receiver.

In some examples, the apparatus may include logic coupled with the decoder or included in the decoder and configured to track a previous voltage level of the transmission line.

Another apparatus is described. The apparatus may include a first device configurable to operate according to a PAM scheme and logic coupled with the first device and operable to cause the apparatus to transmit, from the first device to a second device, a first signal at a first voltage level of the PAM scheme including three or more voltage levels, the first voltage level corresponding to a first multi-bit value, select, at the first device, a second voltage level of the PAM scheme based at least in part on a first voltage difference between the first voltage level and a third voltage level of the PAM scheme that corresponds to a second multi-bit value being greater than a threshold, the second voltage level indicating the second multi-bit value and having a second voltage difference from the first voltage level that is less than the first voltage difference, and transmit, from the first device to the second device based at least in part on transmitting the first signal at the first voltage level, a second signal at the second voltage level of the PAM scheme, the second voltage level indicating the second multi-bit value corresponding to the third voltage level of the PAM scheme.

In some examples of the apparatus, transmitting the second signal at the second voltage level indicates for the second device to determine the second multi-bit value based at least in part on the first voltage level.

In some examples of the apparatus, the second signal may be transmitted at the second voltage level as a next signal after transmitting the first signal at the first voltage level.

In some examples, the logic may be further operable to cause the apparatus to transmit, from the first device to the second device, a third signal at a fourth voltage level of the PAM scheme, the fourth voltage level corresponding to a third multi-bit value, select, at the first device, the second voltage level of the PAM scheme for transmission of a fourth signal based at least in part on a third voltage difference between the fourth voltage level and a fifth voltage level of the PAM scheme that corresponds to a fourth multi-bit value being greater than a second threshold, the second voltage level indicating the fourth multi-bit value and having a fourth voltage difference from the fourth voltage level that may be less than the third voltage difference, and transmit, from the first device to the second device, the fourth signal at the second voltage level of the PAM scheme, the second voltage level indicating the fourth multi-bit value corresponding to the fifth voltage level based at least in part on transmitting the third signal at the fourth voltage level.

In some examples of the apparatus, the first voltage level and the fifth voltage level may be greater than the second voltage level and the third voltage level and the fourth voltage level may be less than the second voltage level.

In some examples of the apparatus, the first voltage level and the fifth voltage level may be less than the second voltage level and the third voltage level and the fourth voltage level may be greater than the second voltage level.

In some examples of the apparatus, the first voltage level may be greater than the second voltage level and the third voltage level may be less than the second voltage level.

In some examples of the apparatus, the first voltage level may be less than the second voltage level and the third voltage level may be greater than the second voltage level.

In some examples of the apparatus, the second voltage level may be a ground voltage level.

In some examples of the apparatus, the first device includes a host device and the second device includes a memory device.

In some examples of the apparatus, the first device includes a memory device and the second device includes a host device.

Another apparatus is described. The apparatus may include a first device configurable to operate according to a PAM scheme and logic coupled with the first device and operable to cause the apparatus to receive, at the first device from a second device, a first signal at a first voltage level of the PAM scheme including three or more voltage levels, the first voltage level corresponding to a first multi-bit value, receive, at the first device from the second device, a second signal at a second voltage level of the PAM scheme, the second voltage level indicating a second multi-bit value that corresponds to a third voltage level of the PAM scheme based at least in part on receiving the first signal at the first voltage level, and decode, at the first device, the second signal to determine the second multi-bit value based at least in part on receiving the first signal at the first voltage level and the second signal at the second voltage level, a first voltage difference between the first voltage level and the third voltage level being greater than a second voltage difference between the first voltage level and the second voltage level.

In some examples of the apparatus, receiving the second signal at the second voltage level indicates for the apparatus to decode the second signal based at least in part on the first voltage level.

In some examples of the apparatus, the second signal may be received at the second voltage level as a next signal after receiving the first signal at the first voltage level.

In some examples, the logic may be further operable to cause the apparatus to receive, at the first device from the second device, a third signal at a fourth voltage level of the PAM scheme, the fourth voltage level corresponding to a third multi-bit value, receive, at the first device from the second device, a fourth signal at the second voltage level, the second voltage level indicating a fourth multi-bit value that corresponds to a fifth voltage level of the PAM scheme based at least in part on receiving the third signal at the fourth voltage level, and decode, at the first device, the fourth signal to determine the fourth multi-bit value based at least in part on receiving the third signal at the fourth voltage level and the fourth signal at the second voltage level, a third voltage difference between the fourth voltage level and the fifth voltage level being greater than a fourth voltage difference between the fourth voltage level and the second voltage level.

In some examples of the apparatus, the first voltage level and the fifth voltage level may be greater than the second voltage level and the third voltage level and the fourth voltage level may be less than the second voltage level.

In some examples of the apparatus, the first voltage level and the fifth voltage level may be less than the second voltage level and the third voltage level and the fourth voltage level may be greater than the second voltage level.

In some examples of the apparatus, the second signal may be received at the second voltage level based at least in part on the first voltage difference satisfying a threshold.

In some examples of the apparatus, the first voltage level may be greater than the second voltage level and the third voltage level may be less than the second voltage level.

In some examples of the apparatus, the first voltage level may be less than the second voltage level and the third voltage level may be greater than the second voltage level.

In some examples of the apparatus, the second voltage level may be a ground voltage level.

In some examples of the apparatus, the first device includes a host device and the second device includes a memory device.

In some examples of the apparatus, the first device includes a memory device and the second device includes a host device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    transmitting, from a first device to a second device, a first signal at a first symbol level of a modulation scheme comprising three or more symbol levels, the first symbol level corresponding to a first multi-bit value; and
    transmitting, from the first device to the second device based at least in part on transmitting the first signal at the first symbol level, a second signal at a second symbol level of the modulation scheme based at least in part on a first voltage difference between the first symbol level and a third symbol level of the modulation scheme satisfying a threshold, the second symbol level indicating a second multi-bit value corresponding to the third symbol level.

2. The method of claim 1, wherein transmitting the second signal at the second symbol level indicates for the second device to determine the second multi-bit value based at least in part on the first symbol level.

3. The method of claim 1, wherein the second signal is transmitted at the second symbol level as a next signal after transmitting the first signal at the first symbol level.

4. The method of claim 1, further comprising:
- transmitting, from the first device to the second device, a third signal at a fourth symbol level of the modulation scheme, the fourth symbol level corresponding to a third multi-bit value; and
- transmitting, from the first device to the second device, a fourth signal at the second symbol level of the modulation scheme based at least in part on a second voltage difference between the fourth symbol level and a fifth symbol level of the modulation scheme satisfying a second threshold, the second symbol level indicating a fourth multi-bit value corresponding to the fifth symbol level based at least in part on transmitting the third signal at the fourth symbol level.

5. The method of claim 1, wherein the first symbol level is greater than the second symbol level and the third symbol level is less than the second symbol level.

6. The method of claim 1, wherein the first symbol level is less than the second symbol level and the third symbol level is greater than the second symbol level.

7. The method of claim 1, further comprising:
- transmitting, from the first device to the second device, a third signal at the second symbol level, the third signal indicating the second multi-bit value based at least in part on the second signal indicating the second multi-bit value and the third signal being a next signal after transmitting the second signal.

8. The method of claim 1, wherein the modulation scheme is a pulse-amplitude-modulation (PAM) scheme.

9. A method, comprising:
- receiving, at a first device from a second device, a first signal at a first symbol level of a modulation scheme comprising three or more symbol levels, the first symbol level corresponding to a first multi-bit value;
- receiving, at the first device from the second device, a second signal at a second symbol level of the modulation scheme, the second symbol level indicating a second multi-bit value that corresponds to a third symbol level of the modulation scheme based at least in part on receiving the first signal at the first symbol level; and
- decoding, at the first device, the second signal to determine the second multi-bit value based at least in part on receiving the first signal at the first symbol level and the second signal at the second symbol level, the second symbol level being between the first symbol level and the third symbol level.

10. The method of claim 9, wherein receiving the second signal at the second symbol level indicates for the first device to decode the second signal based at least in part on the first symbol level.

11. The method of claim 9, wherein the second signal is received at the second symbol level as a next signal after receiving the first signal at the first symbol level.

12. The method of claim 9, further comprising:
- receiving, at the first device from the second device, a third signal at a fourth symbol level of the modulation scheme, the fourth symbol level corresponding to a third multi-bit value;
- receiving, at the first device from the second device, a fourth signal at the second symbol level, the second symbol level indicating a fourth multi-bit value that corresponds to a fifth symbol level of the modulation scheme based at least in part on receiving the third signal at the fourth symbol level; and
- decoding, at the first device, the fourth signal to determine the fourth multi-bit value based at least in part on receiving the third signal at the fourth symbol level and the fourth signal at the second symbol level, the second symbol level being between the fourth symbol level and the fifth symbol level.

13. The method of claim 9, further comprising:
- receiving, at the first device from the second device, a third signal at the second symbol level, the third signal indicating the second multi-bit value based at least in part on the second signal indicating the second multi-bit value and the third signal being a next signal after transmitting the second signal; and
- decoding, at the first device, the third signal to determine the second multi-bit value based at least in part on receiving the first signal at the first symbol level, the second signal at the second symbol level, and the third signal at the second symbol level.

14. An apparatus, comprising:
- a transmission line of a bus;
- a set of receivers coupled with the transmission line, each receiver of the set of receivers configured to compare a first voltage level of the transmission line with a reference voltage level associated with the receiver; and
- a decoder coupled with the set of receivers and configured to determine a first symbol level of a modulation scheme indicated by the first voltage level based at least in part on a second voltage level of the transmission line corresponding to a second symbol level.

15. The apparatus of claim 14, wherein the first symbol level corresponds to a third voltage level of the transmission line different than the first voltage level.

16. The apparatus of claim 14, wherein the first voltage level indicating the first symbol level is based at least in part on a voltage level of the transmission line transitioning from the second voltage level to the first voltage level.

17. The apparatus of claim 14, wherein the decoder is further configured to determine a third symbol level indicated by the first voltage level based at least in part on a third voltage level of the transmission line corresponding to a fourth symbol level.

18. The apparatus of claim 17, wherein the first voltage level indicating the third symbol level is based at least in part on a voltage level of the transmission line transitioning from the third voltage level to the first voltage level.

19. The apparatus of claim 14, wherein:
- the set of receivers comprises five receivers, each receiver of the five receivers associated with a different reference voltage level; and
- the first voltage level is greater than a first reference voltage level associated with a first receiver and less than a second reference voltage level associated with a second receiver.

20. The apparatus of claim 14, wherein the decoder is further configured to determine a second occurrence of the first symbol level indicated by the first voltage level based at least in part on the first voltage level being maintained on the transmission line.

* * * * *